(12) United States Patent
Araki et al.

(10) Patent No.: US 11,574,810 B2
(45) Date of Patent: Feb. 7, 2023

(54) LITHOGRAPHIC PRINTING PLATE PRECURSOR, METHOD OF PRODUCING LITHOGRAPHIC PRINTING PLATE, AND LITHOGRAPHIC PRINTING METHOD

(71) Applicant: FUJIFILM Corporation, Tokyo (JP)

(72) Inventors: Kenjiro Araki, Shizuoka (JP); Mamoru Kuramoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 109 days.

(21) Appl. No.: 16/827,271

(22) Filed: Mar. 23, 2020

(65) Prior Publication Data

US 2020/0234948 A1 Jul. 23, 2020

Related U.S. Application Data

(63) Continuation of application No. 16/191,784, filed on Nov. 15, 2018, now abandoned, which is a (Continued)

(30) Foreign Application Priority Data

Feb. 28, 2017 (JP) .............................. JP2017-037664

(51) Int. Cl.
*H01L 21/027* (2006.01)
*G03F 7/20* (2006.01)
(Continued)

(52) U.S. Cl.
CPC ........ *H01L 21/0274* (2013.01); *B41C 1/1008* (2013.01); *G03F 7/00* (2013.01);
(Continued)

(58) Field of Classification Search
CPC ....................................................... G03F 7/20
See application file for complete search history.

(56) References Cited

U.S. PATENT DOCUMENTS 5,440,042 A 8/1995 Fabricius et al.
5,576,443 A * 11/1996 Fabricius ............... G03C 1/832
548/215
(Continued)

FOREIGN PATENT DOCUMENTS

EP 2 072 570 A1 6/2009
EP 2 328 753 A1 6/2011
(Continued)

OTHER PUBLICATIONS

Extended European Search Report dated Jul. 17, 2019 issued by the European Patent Office in EP application No. 18761027.4.
(Continued)

*Primary Examiner* — Chanceity N Robinson
(74) *Attorney, Agent, or Firm* — Sughrue Mion, PLLC

(57) ABSTRACT

A lithographic printing plate precursor including an image recording layer containing an infrared absorber represented by Formula I, on a support, and a method of producing a
(Continued)

lithographic printing plate and a lithographic printing method using the lithographic printing plate precursor.

B41C 2210/04 (2013.01); B41C 2210/08 (2013.01); B41C 2210/22 (2013.01); B41C 2210/24 (2013.01)

(56) References Cited

U.S. PATENT DOCUMENTS

| | | | | |
|---|---|---|---|---|
| 7,166,411 | B2 * | 1/2007 | Nakamura | B41C 1/1008 430/270.1 |
| 7,291,443 | B2 * | 11/2007 | Shimada | B41C 1/1008 430/281.1 |
| 7,910,286 | B2 * | 3/2011 | Mitsumoto | G03F 7/11 430/286.1 |
| 2003/0157433 | A1 * | 8/2003 | Timpe | B41C 1/1008 430/273.1 |
| 2011/0287364 | A1 | 11/2011 | Callant | |
| 2013/0078573 | A1 | 3/2013 | Balbinot et al. | |
| 2016/0334705 | A1 * | 11/2016 | Kamiya | G03F 7/20 |
| 2018/0361774 | A1 * | 12/2018 | Aizu | B41M 1/00 |

FOREIGN PATENT DOCUMENTS

| | | | |
|---|---|---|---|
| EP | 2328753 B1 * | 11/2016 | B41C 1/1025 |
| JP | 11-265062 A | 9/1999 | |
| JP | 2005-516804 A | 6/2005 | |
| JP | 2007-050659 A | 3/2007 | |
| JP | 2014-528098 A | 10/2014 | |
| WO | 2010/031758 A1 | 3/2010 | |
| WO | 2014/078140 A1 | 5/2014 | |

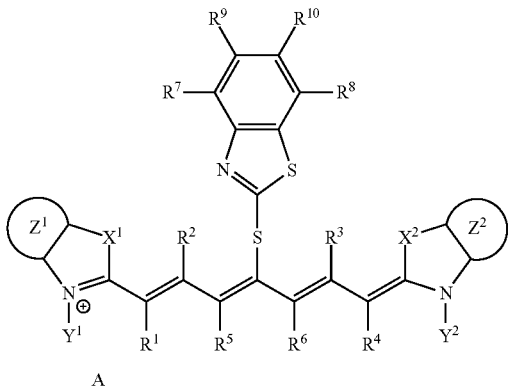

Formula I

A

8 Claims, 1 Drawing Sheet

Related U.S. Application Data continuation of application No. PCT/JP2018/007612, filed on Feb. 28, 2018.

(51) Int. Cl.

| | |
|---|---|
| *G03F 7/30* | (2006.01) |
| *H01L 21/02* | (2006.01) |
| *G03F 7/004* | (2006.01) |
| *G03F 7/00* | (2006.01) |
| *G03F 7/029* | (2006.01) |
| *B41C 1/10* | (2006.01) |

(52) U.S. Cl.

CPC .............. *G03F 7/004* (2013.01); *G03F 7/029* (2013.01); *G03F 7/2053* (2013.01); *G03F 7/3064* (2013.01); *H01L 21/02288* (2013.01);

OTHER PUBLICATIONS

Communication dated Aug. 21, 2019, from the State Intellectual Property Office of the P.R.C in Chinese application No. 201880002111.2.
Machine Translation of JP 2007-050689 A (Year: 2019).
International Search Report for PCT/JP2018/007612 dated Apr. 3, 2018 [PCT/ISA/210].
Written Opinion for PCT/JP2018/007612 dated Apr. 3, 2018 [PCT/ISA/237].
Communication dated Mar. 10, 2020, from the Indian Patent Office in Indian application No. 201847048330.
Office Action dated Sep. 13, 2022 issued by the Brazilian Patent Office in Brazilian Application No. BR112019015835-9.

* cited by examiner

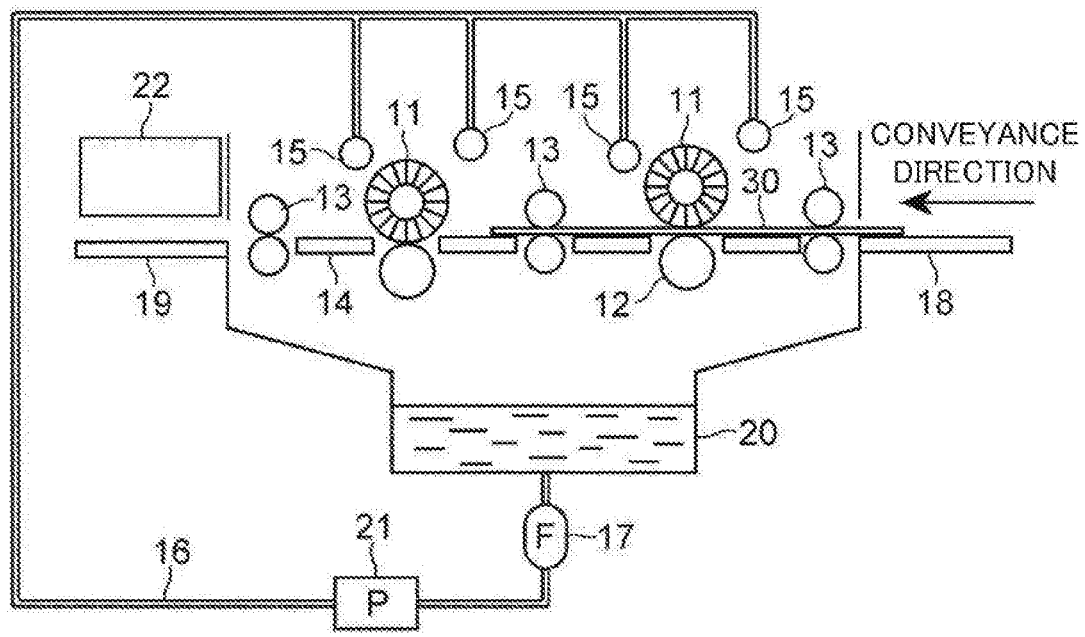

LITHOGRAPHIC PRINTING PLATE PRECURSOR, METHOD OF PRODUCING LITHOGRAPHIC PRINTING PLATE, AND LITHOGRAPHIC PRINTING METHOD

CROSS-REFERENCE TO RELATED APPLICATIONS

This application is a continuation application of U.S. application Ser. No. 16/191,784, filed Nov. 15, 2018, which is a continuation application of International Application No. PCT/JP2018/007612, filed Feb. 28, 2018, which claims priority from Japanese Patent Application No. 2017-037664, filed Feb. 28, 2017, the disclosures of all of which are incorporated herein by reference in their entirety.

TECHNICAL FIELD

The present disclosure relates to a lithographic printing plate precursor, a method of producing a lithographic printing plate, and a lithographic printing method.

BACKGROUND ART

A general lithographic printing plate includes a lipophilic image area that receives ink in the course of printing, and a hydrophilic non-image area that receives dampening water. Lithographic printing is a method including generating the difference in ink adhesiveness to a lithographic printing plate surface by a property of mutual repulsion between water and an oil-based ink, with a lipophilic image area and a hydrophilic non-image area of a lithographic printing plate being defined as an ink receiving area and a dampening water receiving area (ink non-receiving area), respectively, fixing the ink onto only the image area, and then transferring the ink to a substrate such as paper for printing.

In order to produce such a lithographic printing plate, a lithographic printing plate precursor (PS plate) has been conventionally widely used where a lipophilic photosensitive resin layer (image recording layer) is provided on a hydrophilic support. The lithographic printing plate is usually obtained by performing plate-making according to a method including performing exposure of a lithographic printing plate precursor through an original drawing such as a lith film, thereafter allowing a portion serving as an image area of an image recording layer to remain, and removing an unnecessary image recording layer other than such a portion with dissolution by an alkaline developer or an organic solvent, to thereby expose a hydrophilic support surface for formation of a non-image area.

An environmental problem about a waste liquid by a wet treatment such as a development treatment has been highlighted from an increased concern with the global environment.

There is directed toward simplification and/or no treatment of development or plate-making in order to address the environmental problem. One simple plate-making method is a method called "on-press development". That is, such a method is a method including exposing a lithographic printing plate precursor, and thereafter not performing conventional development, but mounting the plate precursor to a printer as it is and performing removal of an unnecessary portion of an image recording layer at the initial stage of a usual printing step.

A conventionally known on-press developable lithographic printing plate precursor is described in, for example, Japanese Patent Application Laid-Open (JP-A) No. H11-265062 or International Publication WO 2014/078140.

JP-A No. H11-265062 describes a thermosensitive image formation element including an image recording layer that includes a thermoplastic particle of a styrene homopolymer or copolymer and a hydrophilic polymer containing a carboxyl group on a lithographic printing base having a hydrophilic surface, wherein the image formation element further contains an anionic IR-cyanine pigment present in the image recording layer or a layer adjacent thereto.

WO 2014/078140 describes a negative lithographic printing plate precursor including a specified infrared absorber.

SUMMARY OF INVENTION

Technical Problem

A lithographic printing plate is demanded to be a lithographic printing plate excellent in the number of printing sheets (hereinafter, also referred to as "printing durability".).

The present inventors have made intensive studies, and as a result, have found that there is a following problem: the lithographic printing plate precursor described in each of JP-A No. H11-265062 and WO 2014/078140 is insufficient in printing durability of the resulting lithographic printing plate.

A problem to be solved by any embodiment of the invention is to provide a lithographic printing plate precursor that is excellent in printing durability of the resulting lithographic printing plate, a method of producing a lithographic printing plate, and a lithographic printing method.

Solution to Problem

Solutions for solving the problem include the following aspects.

<1> A lithographic printing plate precursor including an image recording layer containing an infrared absorber represented by Formula I, on a support.

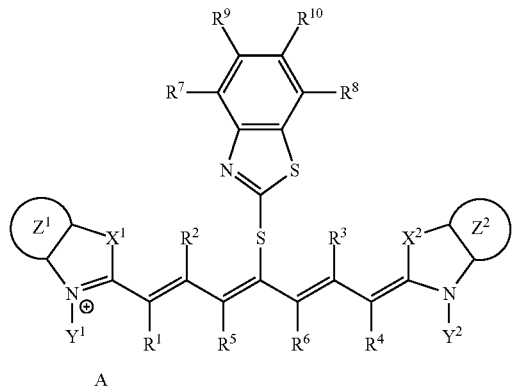

Formula I

In Formula I, each of $X^1$ and $X^2$ independently represents a sulfur atom, an oxygen atom, or a dialkylmethylene group having 12 or less carbon atoms, each of $Y^1$ and $Y^2$ independently represents a monovalent organic group or a hydrogen atom, each of $Z^1$ and $Z^2$ independently represents a benzene ring, a naphthalene ring, or a 6- to 20-membered heteroaromatic ring unsubstituted or substituted with an electron-donating group or an aryl group having from 6 to 20 carbon atoms, each of $R^1$, $R^2$, $R^3$, and $R^4$ independently represents a hydrogen atom or a hydrocarbon group having 12 or less carbon atoms, each of $R^5$ and $R^6$ independently represents a hydrocarbon group which optionally forms a 5-membered ring or a 6-membered ring, each of $R^7$, $R^8$, $R^9$, and $R^{10}$ independently represents a hydrogen atom or a monovalent organic group, and A represents a counter ion present in a case in which charge neutralization is needed.

<2> The lithographic printing plate precursor according to <1>, wherein the infrared absorber represented by Formula I is an infrared absorber represented by Formula II.

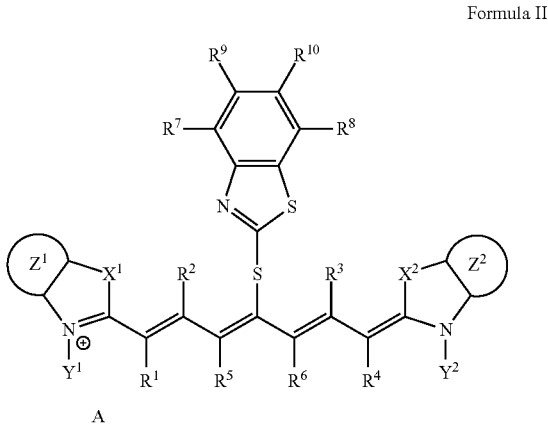

Formula II

In Formula II, each of $X^1$ and $X^2$ independently represents a sulfur atom, an oxygen atom, or a dialkylmethylene group having 12 or less carbon atoms, each of $Y^1$ and $Y^2$ independently represents a monovalent organic group or a hydrogen atom, each of $Z^1$ and $Z^2$ independently represents a benzene ring, a naphthalene ring, or a 6- to 20-membered heteroaromatic ring unsubstituted or substituted with an electron-donating group or an aryl group having from 6 to 20 carbon atoms, each of $R^1$, $R^2$, $R^3$, and $R^4$ independently represents a hydrogen atom or a hydrocarbon group having 12 or less carbon atoms, each of $R^7$, $R^8$, $R^9$, and $R^{10}$ h independently represents a hydrogen atom or a monovalent organic group, and A represents a counter ion present in a case in which charge neutralization is needed.

<3> The lithographic printing plate precursor according to <1> or <2>, wherein the image recording layer further contains a polymerizable compound and a polymerization initiator.

<4> The lithographic printing plate precursor according to <3>, wherein the polymerization initiator is an iodonium-based polymerization initiator.

<5> The lithographic printing plate precursor according to any one of <1> to <4>, wherein the image recording layer further contains a thermoplastic polymer particle.

<6> The lithographic printing plate precursor according to <5>, wherein the polymer contained in the thermoplastic polymer particle contains any or both monomer units of a monomer unit derived from styrene and a monomer unit derived from an acrylic compound.

<7> The lithographic printing plate precursor according to <5> or <6>, wherein the polymer contained in the thermoplastic polymer particle is a styrene-acrylonitrile resin.

<8> The lithographic printing plate precursor according to any one of <5> to <7>, wherein the weight average molecular weight of the polymer contained in the thermoplastic polymer particle is from 5,000 to 1,000,000.

<9> The lithographic printing plate precursor according to any one of <5> to <8>, wherein the volume average particle size of the thermoplastic polymer particle is from 0.01 μm to 50 μm.

<10> The lithographic printing plate precursor according to any one of <5> to <9>, wherein the content of the thermoplastic polymer particle with respect to the total mass of the image recording layer is from 20% by mass to 95% by mass.

<11> The lithographic printing plate precursor according to any one of <1> to <10>, wherein the image recording layer further contains a leuco compound.

<12> The lithographic printing plate precursor according to any one of <1> to <11>, wherein the image recording layer is removable by any or both of dampening water and a printing ink.

<13> The lithographic printing plate precursor according to any one of <1> to <12>, wherein the image recording layer is gum-developable.

<14> A method of producing a lithographic printing plate, including an exposure step of image-wise exposing the lithographic printing plate precursor according to any one of <1> to <13>, to form an exposed area and an unexposed area, and an on-press development step of feeding at least one of a printing ink or dampening water to remove the unexposed area.

<15> A lithographic printing method including an exposure step of image-wise exposing the lithographic printing plate precursor according to any one of <1> to <13>, to form an exposed area and an unexposed area, an on-press development step of feeding at least one of a printing ink or dampening water to remove the unexposed area, and a printing step of feeding a printing ink to a lithographic printing plate subjected to on-press development in the on-press development step, to perform printing on a recording medium, in this order.

Advantageous Effects of Invention

According to any embodiment of the invention, there can be provided a lithographic printing plate precursor that is excellent in printing durability of the resulting lithographic printing plate, a method of producing a lithographic printing plate, and a lithographic printing method.

DESCRIPTION OF EMBODIMENTS

Hereinafter, the content of the disclosure will be described in detail. While constituent requirements described below may be described based on representative embodiments of the disclosure, the disclosure is not intended to be limited to such embodiments.

The numerical value range represented by using the term "(from) . . . to . . . " herein indicates a range including the numerical values described before and after the term ". . . to . . . " as the lower limit and the upper limit, respectively Any expression where neither "substituted" nor "unsubstituted" is described, with respect to the expression of any group (atom group) herein, encompasses not only one having no substituent, but also one having any substituent. For example, an "alkyl group" encompasses not only an alkyl group (unsubstituted alkyl group) having no substituent, but also an alkyl group (substituted alkyl group) having any substituent.

Herein, "% by mass" is used for the same meaning as "% by weight", and "part(s) by mass" is used for the same meaning as "part(s) by weight".

Herein, the "step" encompasses not only an independent step, but also any step as long as such any step can achieve an intended object of the "step" even in a case in which such any step cannot be clearly distinguished from other steps.

Herein, a combination of preferable aspects corresponds to a more preferable aspect.

Herein, unless particularly noted, the molecular weight of a polymer component corresponds to the weight average molecular weight (Mw) or the number average molecular weight (Mn) in terms of polystyrene, as measured by gel permeation chromatography (GPC) with tetrahydrofuran (THF) as a solvent.

Lithographic Printing Plate Precursor

The lithographic printing plate precursor according to the disclosure (hereinafter, also simply referred to as "lithographic printing plate precursor".) includes an image recording layer containing an infrared absorber represented by Formula I, on a support.

As described above, the inventor has found that a conventional lithographic printing plate precursor has the problem about enhancement in printing durability.

The inventor has then made intensive studies, and as a result, has found that an infrared absorber represented by Formula I is contained to thereby provide a lithographic printing plate precursor that is excellent in printing durability of the resulting lithographic printing plate.

While the reason why the above effect is exerted is not clear, the reason is considered as follows.

In a case in which the lithographic printing plate precursor according to the disclosure is exposed to infrared light (IR), it is considered that the infrared absorber represented by Formula I, contained in the image recording layer, is decomposed. It is considered that the infrared absorber represented by Formula I, when decomposed, allows any or both of heat generation, and electron transfer to a polymerization initiator, if necessary, included in the image recording layer to be efficiently performed.

Thus, in a case in which the image recording layer includes, for example, a polymerizable compound and a polymerization initiator, it is considered that polymerization of the polymerizable compound efficiently progresses to form a robust image area excellent in printing durability.

It is further considered that the infrared absorber represented by Formula I generates a compound having a mercaptobenzothiazole structure after decomposition. The compound having a mercaptobenzothiazole structure has an excellent chain transfer ability, and therefore, in a case in which the image recording layer includes a polymerizable compound or a polymerization initiator, it is considered that polymerization of the polymerizable compound further efficiently progresses to form a robust image area further excellent in printing durability.

In a case in which the image recording layer includes, for example, a thermoplastic polymer particle, the infrared absorber represented by Formula I is excellent in photothermal conversion efficiency and the amount of heat generation relative to the amount of exposure is increased, and it is therefore considered that the thermoplastic polymer particle is substantially molten to form a robust image area excellent in printing durability.

The pigment represented by Formula I, used in the disclosure, is significantly changed in absorption wavelength due to the decomposition by exposure, and therefore is also excellent in color development property of an exposed region (image area).

In a case in which the image recording layer includes, for example, a color development agent such as a leuco pigment, it is additionally considered that a lithographic printing plate precursor more excellent in color development property is obtained due to an increase in the amount of heat generation.

Hereinafter, the detail of each component included in the lithographic printing plate precursor according to the disclosure will be described.

Image Recording Layer

The image recording layer in the disclosure includes an infrared absorber represented by Formula I (also referred to as "specified infrared absorber".).

The image recording layer in the disclosure preferably corresponds to any aspect of the following first aspect to fifth aspect.

First aspect: containing a specified infrared absorber, a polymerizable compound, and a polymerization initiator.

Second aspect: containing a specified infrared absorber and a thermoplastic polymer particle.

Third aspect: further containing a polymer particle or a microgel in the first aspect.

Fourth aspect: further containing a thermoplastic polymer particle in the first aspect.

Fifth aspect: further containing a microgel in the fourth aspect.

According to the first aspect or the second aspect, there is obtained a lithographic printing plate precursor that is excellent in printing durability of the resulting lithographic printing plate.

According to the third aspect, there is obtained a lithographic printing plate precursor excellent in on-press development property.

According to the fourth aspect, there is obtained a lithographic printing plate precursor further excellent in printing durability.

According to the fifth aspect, there is obtained a lithographic printing plate precursor further excellent in printing durability.

Specified Infrared Absorber

The image recording layer in the disclosure includes a specified infrared absorber.

Formula I

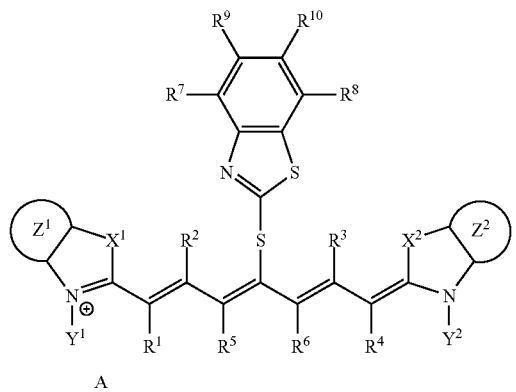

In Formula I, each of $X^1$ and $X^2$ independently represents a sulfur atom, an oxygen atom, or a dialkylmethylene group having 12 or less carbon atoms, each of $Y^1$ and $Y^2$ independently represents a monovalent organic group or a hydrogen atom, each of $Z^1$ and $Z^2$ independently represents a benzene ring, a naphthalene ring, or a 6- to 20-membered heteroaromatic ring unsubstituted or substituted with an electron-donating group or an aryl group having from 6 to 20 carbon atoms, each of $R^1$, $R^2$, $R^3$, and $R^4$ independently represents a hydrogen atom or a hydrocarbon group having 12 or less carbon atoms, each of $R^5$ and $R^6$ independently represents a hydrocarbon group which optionally forms a 5-membered ring or a 6-membered ring, each of $R^7$, $R^8$, $R^9$, and $R^{10}$ independently represents a hydrogen atom or a monovalent organic group, and A represents a counter ion present in a case in which charge neutralization is needed.

In Formula I, each of $X^1$ and $X^2$ independently represents preferably a dialkylmethylene group having 12 or less carbon atoms, more preferably a dialkylmethylene group where the number of carbon atoms of each of two alkyl groups is independently 1 to 4, still more preferably a dimethylmethylene group.

$X^1$ and $X^2$ may differ in structure, and are preferably the same in structure.

In Formula I, each of $Y^1$ and $Y^2$ independently represents preferably a monovalent organic group, more preferably an alkyl group having from 1 to 10 carbon atoms, an alkoxyalkyl group having from 2 to 10 carbon atoms, an aryloxyalkyl group having from 7 to 24 carbon atoms, or an alkylsulfonic acid group having from 1 to 10 carbon atoms, still more preferably an alkyl group having from 1 to 10 carbon atoms, an alkoxyalkyl group having from 2 to 10 carbon atoms, or an alkylsulfonic acid group having from 1 to 10 carbon atoms, and particularly preferably an ethyl group, a propyl group, or a methoxypropyl group, most preferably a methoxypropyl group from the viewpoint of solubility in the composition.

The alkyl group having from 1 to 10 carbon atoms is more preferably an alkyl group having from 2 to 4 carbon atoms, more preferably an ethyl group or a propyl group.

The alkoxyalkyl group having from 2 to 10 carbon atoms is preferably an alkoxyalkyl group having from 2 to 6 carbon atoms, more preferably a methoxyethyl group, an ethoxyethyl group, a propoxyethyl group, a methoxypropyl group, an ethoxypropyl group, or a propoxypropyl group, still more preferably a methoxypropyl group.

The alkoxyalkyl group having from 7 to 24 carbon atoms is preferably a phenoxymethyl group, a phenoxyethyl group, a phenoxypropyl group, a naphthoxymethyl group, a naphthoxyethyl group, or a naphthoxypropyl group.

The alkylsulfonic acid group having from 1 to 10 carbon atoms is preferably an alkylsulfonic acid group having from 1 to 8 carbon atoms, more preferably an alkylsulfonic acid group having from 1 to 6 carbon atoms. The sulfonic acid included in the alkylsulfonic acid group may form a salt together with a known cation. Examples of such a cation include a cation included in A described below.

$Y^1$ and $Y^2$ may differ in structure, and are preferably the same in structure.

In Formula I, each of $Z^1$ and $Z^2$ independently represents a benzene ring, a naphthalene ring, or a 6- to 20-membered heteroaromatic ring unsubstituted or substituted with an electron-donating group or an aryl group having from 6 to 20 carbon atoms, more preferably a benzene ring, a naphthalene ring, or a 6- to 20-membered heteroaromatic ring substituted with an electron-donating group, still more preferably a benzene ring or a naphthalene ring substituted with an electron-donating group.

Examples of the hetero atom included in the hetero aromatic ring include a nitrogen atom, an oxygen atom, or a sulfur atom.

It is considered that printing durability is more excellent because $Z^1$ and $Z^2$ each have the structure.

In the disclosure, the electron-donating group refers to a substituent which has the effect of being bound at a specified position of a molecule to increase the electron density at the specified position.

The electron-donating group is preferably an alkyl group, an alkoxy group, a hydroxy group, or an amino group, more preferably a methoxy group or an amino group, still more preferably a methoxy group.

Such an electron-donating group may further have a substituent as long as the above effect of increasing the electron density is not impaired.

The alkyl group is preferably an alkyl group having from 1 to 10 carbon atoms, more preferably an alkyl group having from 1 to 4 carbon atoms, still more preferably a methyl group.

The alkoxy group is preferably an alkoxy group having from 1 to 10 carbon atoms, more preferably an alkoxy group having from 1 to 4 carbon atoms, still more preferably a methoxy group.

The amino group is preferably an unsubstituted amino group, a dialkylamino group or a diarylamino group, more preferably a dialkylamino group, still more preferably a dimethylamino group.

The aryl group having from 6 to 20 carbon atoms is preferably a phenyl group or a naphthyl group, more preferably a phenyl group.

The benzene ring, the naphthalene ring, or the 6- to 20-membered heteroaromatic ring in $Z^1$ and $Z^2$ may have a plurality of the electron-donating groups or the aryl groups having from 6 to 20 carbon atoms, and preferably has only one of the electron-donating group or the aryl group having from 6 to 20 carbon atoms.

$Z^1$ and $Z^2$ may differ in structure, and are preferably the same in structure.

In Formula I, each of R', $R^2$, $R^3$, and $R^4$ independently represents preferably a hydrogen atom or an alkyl group having from 1 to 4 carbon atoms, more preferably a hydrogen atom.

In Formula I, each of $R^5$ and $R^6$ independently represents preferably an alkyl group having from 1 to 4 carbon atoms.

In Formula I, each of $R^5$ and $R^6$ is preferably linked to form a 5-membered ring or a 6-membered ring from the viewpoint of printing durability and color development property.

In Formula I, each of $R^7$, $R^8$, $R^9$, and $R^{19}$ independently represents preferably a hydrogen atom, an alkyl group having from 1 to 4 carbon atoms, an alkoxy group having from 1 to 4 carbon atoms, an alkoxyalkyl group having from 2 to 6 carbon atoms, or a halogen atom (halogeno group), more preferably a hydrogen atom.

The halogen atom is preferably a fluorine (F) atom, a chlorine (Cl) atom, a bromine (Br) atom, or an iodine (I) atom, more preferably a F atom or a Cl atom.

A represents a counter ion necessary for charge neutralization, and may represent an anion or a cation.

A structure of the infrared absorber represented by Formula I, except for the counter ion, corresponds to an electrically neutral structure, and A is unnecessary when charge neutralization is unnecessary.

In a case in which A represents an anion, examples of such an anion include a sulfonate ion, a carboxylate ion, a tetrafluoroborate ion, a tetraarylborate ion, a hexafluorophosphate ion, a p-toluenesulfonate ion, and a perchlorate ion, and such an anion is preferably a tetraarylborate ion, more preferably a tetraphenylborate ion, from the viewpoint of printing durability of the resulting lithographic printing plate and color development property of the lithographic printing plate precursor.

In a case in which A represents a cation, examples of such a cation include an alkaline-metal ion, an alkaline-earth metal ion, an ammonium ion, a pyridinium ion, or a sulfonium ion, and such a cation is preferably a sulfonium ion, from the viewpoint of printing durability of the resulting lithographic printing plate and color development property of the lithographic printing plate precursor.

Infrared Absorber Represented by Formula II

The infrared absorber represented by Formula I is preferably an infrared absorber represented by Formula II from the viewpoint of printing durability and color development property.

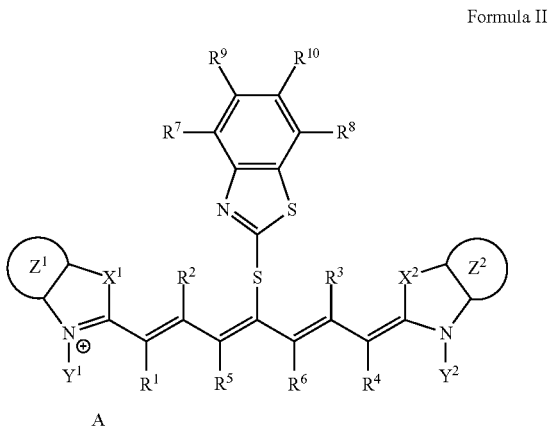

Formula II

In Formula II, each of $X^1$ and $X^2$ independently represents a sulfur atom, an oxygen atom, or a dialkylmethylene group having 12 or less carbon atoms, each of $Y^1$ and $Y^2$ independently represents a monovalent organic group or a hydrogen atom, each of $Z^1$ and $Z^2$ independently represents a benzene ring, a naphthalene ring, or a 6- to 20-membered heteroaromatic ring unsubstituted or substituted with an electron-donating group or an aryl group having from 6 to 20 carbon atoms, each of $R^1$, $R^2$, $R^3$, and $R^4$ independently represents a hydrogen atom or a hydrocarbon group having 12 or less carbon atoms, each of $R^7$, $R^8$, $R^9$, and $R^{10}$ independently represents a hydrogen atom or a monovalent organic group, and A represents a counter ion present in a case in which charge neutralization is needed.

In Formula II, $X^1$, $X^2$, $Y^1$, $Y^2$, $Z^1$, $Z^2$, $R^1$, $R^2$, $R^3$, $R^4$, $R^7$, $R^8$, $R^9$, $R^{10}$, and A have the same meaning as in $X^1$, $X^2$, $Y^1$, $Y^2$, $Z^1$, $Z^2$, $R^1$, $R^2$, $R^3$, $R^4$, $R^7$, $R^8$, $R^9$, $R^{10}$, and A in Formula I, and much the same is true on a preferable aspect.

The specified infrared absorber may be used singly, or in combination/mixture of two or more kinds thereof.

The content of the specified infrared absorber is preferably from 0.05% by mass to 30% by mass, more preferably from 0.1% by mass to 20% by mass, still more preferably from 0.2% by mass to 10% by mass with respect to the total mass of the image recording layer.

Hereinafter, specific examples of the specified infrared absorber will be described, but the specified infrared absorber is not limited to such examples.

TABLE 1

| No. | $Z^3$ | $R^{a1}$ and $R^{a2}$ | $Y^1$ and $Y^2$ | A |
|---|---|---|---|---|
| IR-1 | 6 | None | Methyl group | $BPh_4$ |
| IR-2 | 5 | None | Methyl group | $BPh_4$ |
| IR-3 | 6 | Methyl group | Methoxypropyl group | $BPh_4$ |
| IR-4 | 6 | Methyl group | Methoxypropyl group | OTf |
| IR-5 | 6 | Methyl group | Methoxypropyl group | OTs |
| IR-6 | 6 | Methyl group | Methoxypropyl group | $BF_4$ |
| IR-7 | 6 | Methyl group | Methoxypropyl group | $PF_6$ |
| IR-8 | 5 | Methyl group | Methoxypropyl group | $BPh_4$ |
| IR-9 | 6 | Methyl group | Methyl group | $BPh_4$ |
| IR-10 | 6 | Methyl group | Ethyl group | $BPh_4$ |
| IR-11 | 6 | Methyl group | n-Propyl group | $BPh_4$ |
| IR-12 | 6 | Methoxy group | Methoxypropyl group | $BPh_4$ |
| IR-13 | 6 | Dimethylamino group | Methoxypropyl group | $BPh_4$ |
| IR-14 | 6 | Phenyl group | Methoxypropyl group | $BPh_4$ |

In Table 1, the numerical values described in the column of $Z^3$ each represent the number of members of a hydrocarbon ring represented by $Z^3$ in the following compound, and the descriptions with respect to $R^{a1}$ and $R^{a2}$, $Y^1$ and $Y^2$, and A represent the structures represented by $R^{a1}$ and $R^{a2}$, $Y^1$ and $Y^2$, and A in the following compound, respectively. Any compound where "None" is described in the column of $R^{a1}$ and $R^{a2}$ means that its benzene ring has no substituent.

In Table 1, Ph represents a phenyl group, OTf represents a triflate ion, and OTs represents a p-toluenesulfonate ion, respectively.

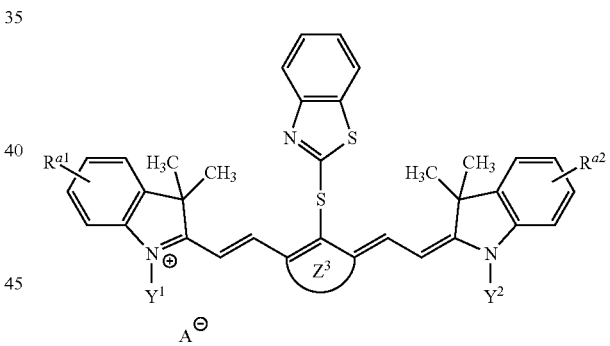

Polymerizable Compound

The polymerizable compound may be a compound having a polymerizable group, and is preferably a compound having a radical polymerizable group.

Examples of the compound having a radical polymerizable group preferably include an ethylenically unsaturated compound.

The ethylenically unsaturated compound may be any of monofunctional and polyfunctional, and is preferably a polyfunctional ethylenically unsaturated compound, and is more preferably a tri- or higher polyfunctional ethylenically unsaturated compound and still more preferably a deca- or higher polyfunctional ethylenically unsaturated compound from the viewpoint of printing durability.

The polymerizable compound is in the chemical form of, for example, a monomer, a prepolymer, namely, a dimer, a trimer, or an oligomer, a polymer, or a mixture thereof.

The polyfunctional ethylenically unsaturated compound is preferably an unsaturated ester of alcohol, more preferably an acrylic acid ester compound and a methacrylic acid ester compound of polyol.

The oligomer or the prepolymer that can be used is, for example, urethane acrylate and methacrylate, epoxide acrylate and methacrylate, polyester acrylate and methacrylate, polyether acrylate and methacrylate, and an unsaturated polyester resin.

In particular, an acrylate compound and a methacrylate compound are preferable, and a polyfunctional acrylate compound and a polyfunctional methacrylate compound are more preferable.

The polymerizable compound preferably has a urethane bond from the viewpoint of printing durability.

Examples of the polymerizable compound having a urethane bond preferably include a urethane (meth)acrylate compound.

Examples of the polymerizable compound include those described in "Photoreactive Polymers: The Science and Technology of Resists" A. Reiser, Wiley, New York, 1989, pages 102-177; "Photopolymers: Radiation Curable Imaging Systems" B. M. Monroe; "Radiation Curing: Science and Technology" edited by S. P. Pappas, Plenum, New York, 1992, pages 399-440; "Polymer imaging" A. B. Cohen and P. Walker; and "Imaging Processes and Material" edited by J. M. Sturge et al., Van Nostrand Reinhold, New York, 1989, pages 226-262.

The molecular weight of the polymerizable compound (weight average molecular weight in a case in which the distribution is present) is preferably from 100 to 5,000, more preferably from 200 to 2,000, still more preferably from 200 to 1,000.

In the disclosure, the molecular weight of a low-molecular compound is measured by mass spectrometry (MS).

The content of the polymerizable compound in the image recording layer is preferably from 10% by mass to 70% by mass, more preferably from 20% by mass to 60% by mass, particularly preferably from 30% by mass to 50% by mass with respect to the total mass of the image recording layer.

Polymerization Initiator

The image recording layer of the lithographic printing plate precursor according to the disclosure preferably includes a polymerization initiator.

In the disclosure, the polymerization initiator is not particularly limited, and any radical polymerization initiator described in JP-A No. 2013-205569 is preferably used. In particular, an oxime ester compound and an onium salt are preferable, onium salts such as an iodonium salt, a sulfonium salt, and an azinium salt are more preferable, and an iodonium salt is still more preferable.

The polymerization initiator may be appropriately used singly, or in combination/mixture of two or more kinds thereof.

Specific examples of the iodonium salt and the sulfonium salt are shown below, but the disclosure is not limited thereto.

The iodonium salt is, for example, preferably a diphenyliodonium salt, particularly preferably a diphenyliodonium salt substituted with an electron-donating group such as an alkyl group or an alkoxyl group, still more preferably an asymmetric diphenyliodonium salt. Specific examples include diphenyliodonium=hexafluorophosphate, 4-methoxyphenyl-4-(2-methylpropyl)phenyliodonium=hexafluorophosphate, 4-(2-methylpropyl)phenyl-p-tolyliodonium= hexafluorophosphate, 4-hexyloxyphenyl-2,4,6-trimethoxyphenyliodonium=hexafluorophosphate, 4-hexyloxyphenyl-2,4-diethoxyphenyliodonium=tetrafluoroborate, 4-octyloxyphenyl-2,4,6-trimethoxyphenyliodonium=1-perfluorobutanesulfonate, 4-octyloxyphenyl-2,4,6-trimethoxyphenyliodonium=hexafluorophosphate, and bis(4-t-butylphenyl)iodonium=tetraphenylborate.

Examples of the sulfonium salt include triphenylsulfonium=hexafluorophosphate, triphenylsulfonium=benzoylformate, bis(4-chlorophenyl)phenylsulfonium=benzoylformate, bis(4-chlorophenyl)-4-methylphenylsulfonium=tetrafluoroborate, tris(4-chlorophenyl)sulfonium=3,5-bis(methoxycarbonyl)benzenesulfonate, and tris(4-chlorophenyl)sulfonium=hexafluorophosphate.

Examples of the polymerization initiator that can be used include peroxide such as benzoyl peroxide; hydroperoxide such as cumyl hydroperoxide; an azo compound such as azobis-isobutyronitrile; a 2,4,5-triarylimidazolyl dimer (hexaarylbisimidazole) described in Dueber et al., U.S. Pat. No. 4,565,769; trihalomethyl triazine; borate; and mixtures thereof.

The content of the polymerization initiator in the image recording layer is preferably from 0.01% by mass to 20% by mass, more preferably from 0.1% by mass to 15% by mass, still more preferably from 1.0% by mass to 10% by mass with respect to the total mass of the image recording layer.

Hereinafter, preferable examples of the polymerization initiator will be shown, but the disclosure is not limited thereto.

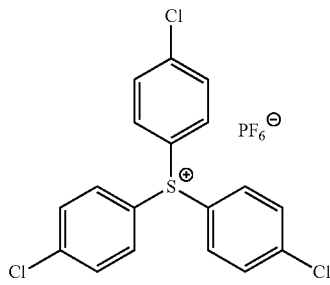

A-1

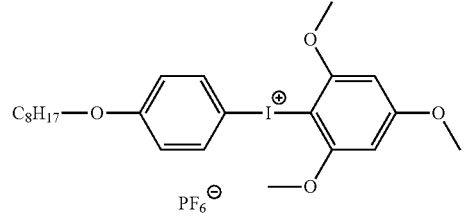

A-2

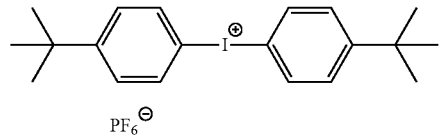

A-3

Sensitizer

The image recording layer may further contain a sensitizer.

Examples of such a combination of the sensitizer and the polymerization initiator used include trihalomethyl triazine as a single photosensitizer or a combination with a separate photosensitizer, described in, for example, U.S. Pat. No. 4,997,745 (Kawamura et al.); a spectral sensitizer for visible light activation, in the same form as trihalomethyl triazine, described in, for example, U.S. Pat. No. 5,599,650 (Bi et al.); a polycarboxylic acid co-initiator such as anilino-N,N-diacetic acid, as well as a secondary co-initiator such as a diaryliodonium salt, titanocene, haloalkyltriazine, hexaarylbisimidizole, and borate, and 3-ketocumarin for ultraviolet light and visible light activation, in the same form as an photooxidant containing a heterocyclic nitrogen atom substituted with an alkoxy group or an acyloxy group, described in, for example, U.S. Pat. No. 5,942,372 (West et al.); a cyanine pigment, a diaryliodonium salt, and a co-initiator having a carboxylic acid group bound to a N, O or S group directly bound to an aromatic ring via a methylene group, described in, for example, U.S. Pat. No. 5,368,990 (Kawabata et al.); trihalomethyl triazine and a cyanine pigment for infrared light activation in the same form as an organic boron salt, described in, for example, U.S. Pat. No. 5,496,903 (Watanabe et al.); a compound including an infrared absorber, trichloromethyl triazine, and an azinium compound, which can generate a free radical for initiation, as well as a polycarboxylic acid co-initiator having a carboxylic acid group bound to a N, O or S group directly bound to an aromatic ring via a methylene group, described in, for example, U.S. Pat. No. 6,309,792 (Hauck et al.).

Microgel and Polymer Particle

The image recording layer may contain a microgel or a polymer particle for enhancement in on-press development property of the lithographic printing plate precursor. The microgel and the polymer particle are preferably either crosslinked or molten, or both, due to light and/or heat by irradiation with infrared light, or modified so as to have hydrophobicity. The microgel and the polymer particle are preferably each at least one selected from the group consisting of a non-crosslinkable microgel, a crosslinkable microgel, a thermoplastic polymer particle, a thermally reactive polymer particle, and a polymer particle having a polymerizable group. The microgel and the polymer particle may have a core-shell structure, or may encapsulate other compound therein.

Thermoplastic Polymer Particle

Examples of the thermoplastic polymer particle suitably include polymer particles described in Research Disclosure No. 33303, January 1992, JP-A No. H9-123387, JP-A No. H9-131850, JP-A No. H9-171249, JP-A No. H9-171250, and EP 931647.

Specific examples of the polymer included in the thermoplastic polymer particle include homopolymers or copolymers of monomers such as ethylene, styrene, vinyl chloride, methyl acrylate, ethyl acrylate, methyl methacrylate, ethyl methacrylate, vinylidene chloride, acrylonitrile, vinyl carbazole, acrylate or methacrylate having a polyalkylene structure, or mixtures thereof. Specific examples preferably include polystyrene, a copolymer including styrene and acrylonitrile, and polymethyl methacrylate.

The polymer included in the thermoplastic polymer particle preferably contains any or both monomer units of a monomer unit derived from styrene and a monomer unit derived from an acrylic compound, preferably contains both monomer units of a monomer unit derived from styrene and a monomer unit derived from an acrylic compound. That is, the thermoplastic polymer particle is preferably a styrene-acrylonitrile particle.

The styrene-acrylonitrile particle may contain a monomer unit derived from a macromonomer.

The macromonomer means a monomer having a macromolecular chain and a polymerizable group, and, for example, a monofunctional macromonomer can be copolymerized to simply form a graft polymer.

The number average molecular weight of the macromonomer is preferably from 300 to 10,000.

The macromonomer is preferably a poly(alkylene glycol) alkyl ether (meth)acrylate compound, more preferably a poly(ethylene glycol) alkyl ether (meth)acrylate compound, more preferably a poly(ethylene glycol) alkyl ether methacrylate compound. Such an aspect imparts more excellent on-press development property.

The thermoplastic polymer particle used in the disclosure preferably contains a monomer unit derived from styrene (monomer unit St) and a monomer unit derived from acrylonitrile (monomer unit AN) at a ratio of monomer unit St: monomer unit AN=100:0 to 60:40 (mass ratio), more preferably at a ratio of monomer unit St: monomer unit AN=100:0 to 80:20 (mass ratio).

The content of the monomer unit derived from the macromonomer in the thermoplastic polymer particle is preferably from 0% by mass to 40% by mass, more preferably from 0% by mass to 20% by mass with respect to the total mass of the polymer included in the thermoplastic polymer particle.

It is noted that the macromonomer is handled as one monomer and a monomer unit forming one macromonomer is not considered in definition of the number of monomer units in the disclosure.

The weight average molecular weight of the polymer included in the thermoplastic polymer particle is preferably from 5,000 to 1,000,000, more preferably from 8,000 to 80,000, more preferably from 10,000 to 50,000 from the viewpoint of printing durability.

The volume average particle size of the thermoplastic polymer particle is preferably from 0.01 µm to 50 µm, more preferably from 0.02 µm to 30 µm, still more preferably from 0.05 µm to 20 µm.

The volume average particle size of the thermoplastic polymer particle is measured using a nanotrac particle size distribution analyzer UPA-EX150 (manufactured by Nikkiso Co., Ltd.) according to a dynamic light scattering method.

The thermoplastic polymer particle may be used singly, or in combination/mixture of two or more kinds thereof, in the image recording layer used in the disclosure.

The content of the thermoplastic polymer particle with respect to the total mass of the image recording layer is preferably from 10% by mass to 98% by mass, more preferably from 20% by mass to 95% by mass, still more preferably from 25% by mass to 90% by mass.

Thermally Reactive Polymer Particle

Examples of the thermally reactive polymer particle include a polymer particle having a thermally reactive group. The polymer particle having a thermally reactive group forms a hydrophobicized region by crosslinking due to a heat reaction and the change in functional group here.

The thermally reactive group in the polymer particle having a thermally reactive group may be any functional group that allows for any reaction, as long as a chemical bond is formed, and the thermally reactive group is preferably a polymerizable group. Examples thereof suitably include ethylenically unsaturated groups (for example, an acryloyl group, a methacryloyl group, a vinyl group, and an allyl group) and cation polymerizable groups (for example, a vinyl group, a vinyloxy group, an epoxy group, and an oxetanyl group) for a radical polymerization reaction, isocyanate groups for an addition reaction or block bodies thereof, an epoxy group, a vinyloxy group, and a functional group (for example, an amino group, a hydroxy group, or a carboxy group) having an active hydrogen atom which is a reaction partner therewith, a carboxy group which performs a condensation reaction, and a hydroxy group or an amino group which is a reaction partner therewith, an acid anhydride which performs a ring-opening addition reaction, and an amino group or a hydroxy group which is a reaction partner therewith.

Microcapsule

Examples of the microcapsule include a microcapsule in which all or a part of a constituent component of the image recording layer is encapsulated, as described in JP-A No. 2001-277740 and JP-A No. 2001-277742. The constituent component of the image recording layer can also be contained outside the microcapsule. A preferable aspect of the image recording layer containing the microcapsule is as follows: a hydrophobic constituent component is encapsulated in the microcapsule and a hydrophilic constituent component is contained outside the microcapsule.

Microgel

The microgel can contain a part of the constituent component of the image recording layer in at least one of the inside or the surface thereof. In particular, an aspect where the microgel has a radical polymerizable group on the surface thereof and is thus formed into a reactive microgel is preferable from the viewpoint of image formation sensitivity and printing durability.

A known method can be used in order to microencapsulate or microgelate the constituent component of the image recording layer.

In a case in which the polymer is contained in the form of a polymer particle other than the microcapsule, the microgel or the thermoplastic polymer particle in the image recording layer according to the disclosure, the average primary particle size of the polymer particle other than the microcapsule, the microgel or the thermoplastic polymer particle is preferably from 10 nm to 1,000 nm, more preferably from 20 nm to 300 nm, still more preferably from 30 nm to 120 nm.

The average primary particle size of the particle in the disclosure is obtained by taking an electron micrograph of the particle, measuring 5,000 particle sizes in total in the micrograph, and calculating the average value. The particle size of a non-spherical particle is defined as the particle size value of a spherical particle having the same particle area as the non-spherical particle in the micrograph.

The content of the polymer particle other than the microgel or the thermoplastic polymer particle is preferably from 5% by mass to 90% by mass with respect to the total solid content of the image recording layer.

Other Infrared Absorber

The image recording layer in the embodiment may further contain an infrared absorber (also referred to as "other infrared absorber".) other than the infrared absorber represented by Formula I.

Examples of such other infrared absorber include compounds described in paragraph 0070 to paragraph 0079 of JP-A No. 2017-013318.

In a case in which the image recording layer contains such other infrared absorber, the content is preferably from 0.05% by mass to 30% by mass, more preferably from 0.1% by mass to 20% by mass, still more preferably from 0.2% by mass to 10% by mass with respect to the total mass of the image recording layer.

Colorant

The image recording layer in the embodiment preferably contains a colorant other than the infrared absorber.

The colorant that can be used is, for example, an exposure color development pigment that develops a color by exposure, or an exposure color disappearance pigment that is almost or completely made colorless by exposure. Examples of the exposure color development pigment include a leuco compound. Examples of the exposure color disappearance pigment include a triphenylmethane-based pigment, a diphenylmethane-based pigment, an oxazine-based pigment, a xanthene-based pigment, an iminonaphthoquinone-based pigment, an azomethine-based pigment, and an anthraquinone-based pigment.

Among the above colorants, a leuco compound is preferably contained from the viewpoint of color development property.

The content of the colorant is preferably from 0.05% by mass to 30% by mass, more preferably from 0.1% by mass to 20% by mass, still more preferably from 0.2% by mass to 10% by mass with respect to the total mass of the image recording layer.

Binder Polymer

The image recording layer may contain one or more binder polymers different from that of the polymer particle.

The binder polymers may be particulate or non-particulate, and are preferably non-particulate.

Examples of the binder polymers include water-soluble or water-dispersible polymers, for example, cellulose derivatives such as carboxymethylcellulose, methylcellulose, hydroxypropylmethylcellulose, hydroxypropylcellulose, and hydroxyethylcellulose; polyvinyl alcohol; polyacrylic acid; polymethacrylic acid; polyvinyl pyrrolidone; polylactide, polyvinyl phosphoric acid; synthetic copolymers, for example, copolymers of alkoxy polyethylene glycol acrylate or methacrylate, for example, methoxy polyethylene glycol acrylate or methacrylate, with a monomer such as methyl methacrylate, methyl acrylate, butyl methacrylate, butyl acrylate, or allyl methacrylate; and mixtures thereof.

The content of the binder polymers different from that of the polymer particle in the image recording layer is preferably from 0% by mass to 50% by mass, more preferably from 1% by mass to 30% by mass with respect to the total mass of the image recording layer.

Other Additive

The image recording layer may contain any additive other than the above. Such other additive that can be used is a known additive, and for example, an additive described in JP-A No. 2013-205569 can be appropriately used.

Examples of such other additive include a surfactant.

The total content of such other additive is preferably from 0% by mass to 20% by mass, more preferably from 0% by mass to 5% by mass with respect to the total mass of the image recording layer.

Examples of such other additive include an additive for an increase in storage life of the image recording layer.

Examples of the additive effective for an increase in the storage life include a mercapto compound, an amino compound, a monocarboxylic acid, and a polycarboxylic acid.

A suitable mercapto compound is described in, for example, Timpe et al., U.S. Patent Publication No. 2002/0197564. A suitable polycarboxylic acid described in U.S. Pat. No. 6,309,792 (Hauck et al.) has an aromatic moiety substituted with a hetero atom. Suitable monocarboxylic acid additives are described in Munnelly et al., U.S. Patent Publication No. 2004/0091811, and Munnelly et al., U.S. Patent Publication No. 2004/0259027.

Formation of Image Recording Layer

The method of forming the image recording layer in the disclosure is not particularly limited, and the image recording layer can be formed on a support or an undercoat layer present on the support, described below, according to a known method such as coating or lamination.

Specifically, for example, each component of the image recording layer is dispersed or dissolved in a suitable solvent for coating, for example, water, or a mixed solvent of water with an organic solvent, for example, at least one selected from the group consisting of methanol, ethanol, isopropyl alcohol, and acetone. A surfactant, for example, a fluorinated surfactant or a polyethoxylated dimethylpolysiloxane copolymer, or a mixture of surfactants can be present so as to assist in dispersion of other component in the solvent for coating. The support or the undercoat layer is coated with the resulting mixture according to a known method, for example, spin coating, bar coating, gravure coating, die coating, slot coating, or roller coating.

After coating, the image recording layer is dried by evaporating the solvent. The image recording layer can be air dried at an ambient temperature or a high temperature in a furnace, for example. Alternatively, the image recording layer can also be dried by blowing of hot air thereonto.

The dry coating mass of the image recording layer is preferably from 0.2 g/cm$^2$ to 5.0 g/cm$^2$, more preferably from 0.5 g/cm$^2$ to 1.5 g/cm$^2$, particularly preferably from 0.75 g/cm$^2$ to 1.0 g/cm$^2$.

The image recording layer used in the lithographic printing plate precursor according to the disclosure is preferably removable by any or both of a dampening water composition and a printing ink.

The image recording layer used in the lithographic printing plate precursor according to the disclosure can be preferably developable by using a developer, more preferably gum-developable.

The gum development in the disclosure refers to a method where removal of the non-image area of the image recording layer is performed not using a conventional developer, but by a gum liquid as a finisher conventionally applied after development.

The detail of gum development is described in, for example, JP-A No. 2010-052180.

Support

The support of the lithographic printing plate precursor according to the disclosure can be appropriately selected from known supports for lithographic printing plate precursors, and can be used. The support is preferably an aluminum support subjected to a surface roughening treatment and an anodization treatment according to a known method.

The aluminum support may be, if necessary, further subjected to any treatment appropriately selected, for example, an expansion treatment or a sealing treatment of a micropore of an anodized film, described in JP-A No. 2001-253181 and JP-A No. 2001-322365, a surface hydrophilization treatment with an alkali metal silicate, described in U.S. Pat. Nos. 2,714,066, 3,181,461, 3,280,734, and 3,902,734, ora surface hydrophilization treatment with polyvinylphosphonic acid, described in U.S. Pat. Nos. 3,276,868, 4,153,461, and 4,689,272.

The support preferably has a center line surface roughness of 0.10 μm to 1.2 μm.

The support may have, if necessary, a backcoat layer including an organic polymer compound described in JP-A No. H5-45885 or an alkoxy compound of silicon described in JP-A No. H6-35174, on an opposite surface to the image recording layer.

Surface Roughening Treatment

A surface of the aluminum support, the surface being in contact with the image formation layer or an undercoat layer described below, is preferably subjected to a surface roughening treatment such as physical polishing, electrochemical polishing, or chemical polishing, in particular, before an anodization treatment.

The surface roughness of the support surface by the surface roughening treatment is not particularly limited, and the average roughness (Ra) is preferably from 0.1 μm to 0.8 μm, more preferably from 0.1 μm to 0.6 μm in order that an opening of a pore formed during the anodization treatment has a diameter of from 15 nm to 40 nm.

Anodization Treatment

Examples of the anodization treatment include sulfuric acid anodization and phosphoric acid anodization of the aluminum support. While an opening on a covering surface of a pore formed by sulfuric acid anodization typically has a diameter of less than 20 nm, an opening on a covering surface of a pore formed by phosphoric acid anodization typically has a diameter of 20 nm or more.

The aluminum support is preferably an aluminum support anodized by using phosphoric acid.

The thickness of an anodized film in the aluminum support is not particularly limited as long as the diameter of the opening of the pore is from 15 nm to 40 nm, and the thickness is preferably from 75 nm to 2,000 nm, more preferably from 85 nm to 1,500 nm.

Diameter of Opening of Pore

The diameter of the opening on the anodized film surface of the pore is preferably from 15 nm to 40 nm, preferably from 20 nm to 38 nm, more preferably from 25 nm to 35 nm. In a case in which the diameter is in the range, printing durability and on-press development property are more excellent.

In a case in which the average pore size is 15 nm or more, printing durability is excellent, and in a case in which the average pore size is 40 nm or less, stainproof property is excellent.

The diameter of the opening of the pore in the disclosure refers to the arithmetic average value determined by enlarging the surface of the support at a magnification of 150000-fold by using an electron microscope to measure the diameter of the opening, as the size (diameter) of the pore, for 50 or more pores.

In a case in which the shape of the pore is not a circle shape, the equivalent circle diameter is used. The "equivalent circle diameter" is as follows: in a case in which the shape of the opening of the pore on the anodized film surface is a circle having the same projected area as the projected area of the opening, the diameter of such a circle is defined as "equivalent circle diameter".

Undercoat Layer

The lithographic printing plate precursor according to the disclosure may be provided with an undercoat layer (also sometimes referred to as "intermediate layer".) between the image recording layer and the support.

The undercoat layer easily allows adhesion of the support to the image recording layer to be increased in the exposed area and easily allows the image recording layer to be peeled from the support in the unexposed area, and therefore contributes to enhancement in development property with no printing durability being impaired. In the case of infrared light laser exposure, the undercoat layer serves as a heat-insulating layer and thus prevents reduction in sensitivity due to diffusion of heat generated by exposure to the support.

Specific examples of the compound used in the undercoat layer include a silane coupling agent having an addition-polymerizable ethylenic double bond reactive group described in JP-A No. H10-282679, and a phosphorous compound having an ethylenic double bond reactive group described in JP-A No. H2-304441. Specific examples more preferably include a polymer resin having an adsorbable group which can adsorb to the support surface, a hydrophilic group, and a crosslinkable group, as described in JP-A No. 2005-125749 and JP-A No. 2006-188038. The polymer resin is preferably a copolymer of a monomer having an adsorbable group, a monomer having a hydrophilic group, and a monomer having a crosslinkable group. More specific examples include a polymer resin that is a copolymer of a monomer having an adsorbable group such as a phenolic hydroxy group, a carboxy group, $-PO_3H_2$, $-OPO_3H_2$, $-CONHSO_2-$, $-SO_2NHSO_2-$, or $-COCH_2COCH_3$, a monomer having a hydrophilic sulfo group, and further a monomer having a polymerizable crosslinkable group such as a methacrylic group or an allyl group. The polymer resin may have a crosslinkable group introduced by salt formation of a polar substituent of the polymer resin, with a compound which has a substituent having counter charge and an ethylenically unsaturated bond, or may be further copolymerized with a monomer other than the above, preferably a hydrophilic monomer.

The content of the ethylenically unsaturated double bond in the polymer resin for the undercoat layer is preferably from 0.1 mmol to 10.0 mmol, particularly preferably from 2.0 mmol to 5.5 mmol per gram of the polymer resin.

The weight average molecular weight of the polymer resin for the undercoat layer is preferably 5,000 or more, more preferably from 10000 to 300000.

The undercoat layer can contain, in addition to the compound for the undercoat layer, a chelating agent, a secondary or tertiary amine, a polymerization inhibitor, a compound having an amino group or a functional group having polymerization inhibition ability and a group interacting with the aluminum support surface (for example, 1,4-diazabicyclo [2.2.2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid, or hydroxyethyliminodiacetic acid), or the like for the purpose of stainproofing over time.

The undercoat layer is coated according to a known method. The coating amount (solid content) of the undercoat layer is preferably from 0.1 mg/m$^2$ to 100 mg/m$^2$, more preferably from 1 mg/m$^2$ to 30 mg/m$^2$.

Protective Layer

The lithographic printing plate precursor according to the disclosure may be provided with a protective layer (oxygen blocking layer) on the image recording layer in order that diffusive penetration of oxygen interrupting a polymerization reaction in exposure is blocked.

Any of a water-soluble polymer and a water-insoluble polymer may be appropriately selected and used as the material of the protective layer, and two or more kinds may be, if necessary, mixed and used. Specific examples include polyvinyl alcohol, modified polyvinyl alcohol, polyvinylpyrrolidone, a water-soluble cellulose derivative, and poly(meth)acrylonitrile. In particular, a water-soluble polymer compound relatively excellent in crystallinity is preferably used. Specifically, use of polyvinyl alcohol as a main component imparts particularly favorable results in terms of basic characteristics including oxygen blocking property and development removal property.

The polyvinyl alcohol that can be appropriately used in the protective layer is one described in paragraphs 0216 to 0217 of JP-A No. 2013-205569.

The protective layer preferably further contains an inorganic layered compound for the purpose of enhancements in oxygen blocking property and protection property of the image recording layer surface. A particular useful inorganic layered compound is fluorine-based swellable synthetic mica that is a synthetic inorganic layered compound. Specific examples suitably include an inorganic layered compound described in JP-A No. 2005-119273.

The coating amount of the protective layer is preferably from 0.05 g/m$^2$ to 10 g/m$^2$. The coating amount is still more preferably from 0.1 g/m$^2$ to 5 g/m$^2$ in a case in which the inorganic layered compound is contained, and the coating amount is still more preferably from 0.5 g/m$^2$ to 5 g/m$^2$ in a case in which the inorganic layered compound is not contained.

Backcoat Layer

The lithographic printing plate precursor according to the disclosure can be, if necessary, provided with a backcoat layer on the rear surface of the aluminum support. Examples of the backcoat layer include an organic polymer compound described in JP-A No. H5-45885, and a covering layer made of a metal oxide obtained by hydrolysis and polycondensation of an organic metal compound or an inorganic metal compound described in JP-A No. H6-35174. In particular, an alkoxy compound of silicon, such as Si (OCH$_3$)$_4$, Si (OC$_2$H$_5$)$_4$, Si (OC$_3$H$_7$)$_4$, or Si (OC$_4$H$_9$)$_4$, is preferably used because of being an inexpensive material and being available.

Method of Producing Lithographic Printing Plate, and Lithographic Printing Method The lithographic printing plate precursor according to the disclosure can be subjected to image exposure and a development treatment, to thereby produce a lithographic printing plate.

The lithographic printing plate precursor according to the disclosure may be developed by on-press development after image exposure, or may be developed by development using a developer.

Examples of the developer that can be used include a developer described in JP-A No. 2017-013318 or a developer for gum development described in JP-A No. 2010-052180. An ink and dampening water can be fed to a lithographic printing plate developed by development using the developer, to thereby perform lithographic printing.

The method of producing a lithographic printing plate according to the disclosure includes an exposure step of image-wise exposing the lithographic printing plate precursor according to the disclosure, to form an exposed area and an unexposed area, and an on-press development step of feeding at least one of a printing ink or dampening water to remove the unexposed area, in this order.

The lithographic printing method according to the disclosure includes an exposure step of image-wise exposing the lithographic printing plate precursor according to the disclosure, to form an exposed area and an unexposed area, an on-press development step of feeding at least one of a printing ink or dampening water to remove the unexposed area, and a printing step of feeding a printing ink to a lithographic printing plate subjected to on-press development in the on-press development step, to perform printing on a recording medium, in this order.

Hereinafter, preferable aspects of each step in the method of producing a lithographic printing plate according to the disclosure and the lithographic printing method according to the disclosure are sequentially described. The lithographic printing plate precursor according to the disclosure can also be developed by a developer.

Preferable aspects of the exposure step and the on-press development step in the method of producing a lithographic printing plate according to the disclosure are the same as preferable aspects of the exposure step and the on-press development step in the lithographic printing method according to the disclosure.

Exposure Step

The method of producing a lithographic printing plate according to the disclosure preferably includes an exposure step of image-wise exposing the lithographic printing plate precursor according to the disclosure, to form an exposed area and an unexposed area. The lithographic printing plate precursor according to the disclosure is preferably subjected to laser exposure through a transparent original drawing having a line image, a halftone dot image, and the like. or image-wise exposure by laser light scanning or the like by digital data.

The wavelength in a light source is preferably from 750 nm to 1,400 nm. A light source at a wavelength of from 750 nm to 1,400 nm suitably corresponds to a solid-state laser and a semiconductor laser each emitting infrared light. In the infrared light laser, the output is preferably 100 mW or more, the exposure time per pixel is preferably within 20 microseconds, and the amount of irradiation energy is preferably from 10 mJ/cm$^2$ to 300 mJ/cm$^2$. A multibeam laser device is preferably used in order to shorten the exposure time. The exposure mechanism may be any of an inner drum system, an outer drum system, a flat bed system, and the like.

The image exposure can be performed using a plate setter or the like according to an ordinary method. In the case of on-press development, the lithographic printing plate precursor may be mounted to a printer and then subjected to image exposure on the printer.

On-press Development Step

The method of producing a lithographic printing plate according to the disclosure preferably includes an on-press development step of feeding at least one of a printing ink or dampening water to remove the unexposed area.

The method of producing a lithographic printing plate according to the disclosure may be performed by a method (developer treatment system) including performing development by a developer.

Hereinafter, an on-press development system will be described.

On-Press Development System

It is preferable in the on-press development system that the lithographic printing plate precursor subjected to image exposure is formed into a lithographic printing plate by feeding an oil-based ink and an aqueous component on a printer and removing an image recording layer on the non-image area.

That is, in a case in which the lithographic printing plate precursor is subjected to image exposure and thereafter mounted to a printer as it is with not being subjected to any development treatment, or the lithographic printing plate precursor is mounted to a printer and thereafter subjected to the image exposure on the printer, and thereafter an oil-based ink and an aqueous component are fed for printing, an uncured image recording layer is dissolved or dispersed in and removed by any or both of the oil-based ink and the aqueous component fed, on the non-image area at the initial stage during printing, to allow a hydrophilic surface to be exposed. On the other hand, a cured image recording layer by exposure forms an oil-based ink receiving area having a lipophilic surface, on the exposed area. Any of the oil-based ink and the aqueous component may be first fed to the plate surface, and the oil-based ink is preferably first fed from the viewpoint that the aqueous component is prevented from being contaminated with any image recording layer component removed. The lithographic printing plate precursor is thus subjected to on-press development on the printer, and used as it is for printing of a large number of sheets. The oil-based ink and the aqueous component suitably used are a common printing ink and dampening water for lithographic printing, respectively.

Printing Step

The lithographic printing method according to the disclosure includes a printing step of feeding a printing ink to a lithographic printing plate subjected to on-press development in the on-press development step, to perform printing on a recording medium.

The printing ink is not particularly limited, and various known inks can be used when desired. Examples of the printing ink preferably include an oil-based ink.

In the printing step, dampening water may be, if necessary, fed.

The printing step may be performed continuously following the on-press development step with the printer being not stopped.

The recording medium is not particularly limited, and various known recording media can be used when desired.

The entire surface of the lithographic printing plate precursor may be heated, if necessary, before exposure, during exposure, or until development from exposure, in the method of producing a lithographic printing plate from the lithographic printing plate precursor according to the disclosure, and the lithographic printing method according to the disclosure. Such heating can promote an image formation reaction in the image recording layer, to impart the advantages of enhancements in sensitivity and printing durability, stabilization of sensitivity, and the like. Heating before development is preferably performed in a mild condition of 150° C. or less. The above aspects can allow the problem of curing of the non-image area, and the like to be prevented. A very strong condition is preferably utilized for heating after development, and the range of from 100° C. to 500° C. is preferable. The range can impart a sufficient image reinforcing action, and can suppress the problems of degradation of the support and thermal decomposition of the image area.

EXAMPLES

Hereinafter, the disclosure will be described with reference to Examples in detail. The materials, the amounts used, the proportions, the treatments, the treatment procedures, and the like shown Examples below can be appropriately changed without departing from the gist of embodiments of the disclosure. Accordingly, the scope of embodiments of the disclosure is not limited to specific examples shown below. In Examples, "part(s)" and "%" mean, unless particularly noted, "part(s) by mass" and "% by mass", respectively.

In Examples or Comparative Examples below, IR-1 to IR-14 represent the same specified infrared absorbers as IR-1 to IR-14 described above.

Production of Thermoplastic Polymer Particle

Synthesis of Polymer Particles PL-1 to PL-12

Raw materials described in Table 2 below were used to synthesize polymer particles PL-1 to PL-12 with reference to paragraphs 0177 to 0178 of JP-A No. 2016-068546. The following VAZO-64 was used as the polymerization initiator.

In Table 2 below, the designation "–" means no use of any corresponding monomer.

Each numerical value in the column "particle size" represents each volume average particle size measured by the above method.

The detail of each component used for synthesis is as follows.

Monomer Component

PEGMA: poly(ethylene glycol)methyl ether methacrylate available from Sigma-Aldrich Corp. (St. Louis, Missouri); as an aqueous 50% by mass solution, number average molecular weight: 2080 or less.

Polymerization Initiator

VAZO-64: 2,2'-azobisisobutyronitrile available from E. I. du Pont de Nemours and Co. (Wilmington, Del.).

TABLE 2

| | Compositional ratio (part(s) by mass) | | | |
|---|---|---|---|---|
| No. | Styrene | Acrylonitrile | Polyethyleneoxide group-containing methacrylate (PEGMA) | Particle size (nm) |
| PL-1 | 100 | — | — | 50 |
| PL-2 | 80 | 20 | — | 50 |
| PL-3 | 80 | — | 20 | 50 |
| PL-4 | 80 | 10 | 10 | 10 |
| PL-5 | 80 | 10 | 10 | 30 |
| PL-6 | 80 | 10 | 10 | 50 |
| PL-7 | 80 | 10 | 10 | 100 |
| PL-8 | 80 | 10 | 10 | 200 |
| PL-9 | 80 | 10 | 10 | 300 |
| PL-10 | 60 | 40 | — | 50 |
| PL-11 | 60 | 20 | 20 | 50 |
| PL-12 | 60 | — | 40 | 50 |

Production of Support

An aluminum plate (material: JIS A 1050) having a thickness of 0.3 mm was subjected to a degreasing treatment at 50° C. for 30 seconds with an aqueous 10% by mass soda aluminate solution in order to remove a rolling oil on the surface of the aluminum plate, and thereafter the aluminum plate surface was grained using three nylon brushes implanted with bundled bristles having a diameter of 0.3 mm and an aqueous suspension (specific gravity: 1.1 g/cm$^3$) of pumice having a median diameter of 25 μm, and thoroughly washed with water. The aluminum plate was immersed in an aqueous 25% by mass sodium hydroxide solution at 45° C. for 9 seconds and thus etched, washed with water, then further immersed in an aqueous 20% by mass nitric acid solution at 60° C. for 20 seconds, and washed with water. The amount of etching of the surface grained was about 3 g/m$^2$.

Next, the resultant was subjected to a continuous electrochemical surface roughening treatment using an alternate current voltage of 60 Hz. The electrolytic solution was an aqueous 1% by mass nitric acid solution (containing 0.5% by mass of aluminum ion), and the temperature thereof was 50° C. The electrochemical surface roughening treatment was performed using a rectangular wave alternate current having a trapezoidal waveform so that the time TP until the current value reached the peak from zero was 0.8 msec and the duty ratio was 1:1, by using a carbon electrode as the counter electrode. The auxiliary anode used was ferrite. The current density was 30 A/dm$^2$ in terms of the peak value of current, and 5% of the current flowing from the power source was divided to the auxiliary anode. The amount of electricity at nitric acid electrolysis was 175 C/dm$^2$ which was an amount of electricity when the aluminum plate served as the anode. Thereafter, washing with water by spraying was performed.

Subsequently, the electrochemical surface roughening treatment was performed in the same manner as in the nitric acid electrolysis using an aqueous 0.5% by mass hydrochloric acid solution (containing 0.5% by mass of aluminum ion) in an electrolytic solution at a temperature of 50° C. under a condition where the amount of electricity was 50 C/dm$^2$ when the aluminum plate served as the anode, and thereafter washing with water by spraying was performed.

Next, the aqueous aluminum plate was in an 15% by mass sulfuric acid solution (containing 0.5% by mass of aluminum ion) at a liquid temperature of 54° C., used as the electrolytic solution, to form an anodized film at a direct current of 2.5 g/m² and at a current density of 15 A/dm², and thereafter the anodized film was washed with water and dried to produce a support.

The average pore size (diameter of opening of pore) on the surface layer of the anodized film was 10 nm.

The pore size on the surface layer of the anodized film was measured according to a method where the surface was observed using an ultrahigh resolution SEM (S-900 manufactured by Hitachi Ltd.) at a magnification of 150000-fold at a relatively low acceleration voltage of 12 V without any vapor deposition process for imparting conductivity, and 50 pores were randomly picked to determine the arithmetic average value. The standard deviation was within ±10% with respect to the arithmetic average value.

Formation of Image Recording Layer

An undercoat layer was bar-coated with the following image recording layer coating liquid (1) below, and the resultant was dried in an oven at 100° C. for 60 seconds to form an image recording layer having a dry coating amount of 1.0 g/m².

The image recording layer coating liquid (1) was prepared by mixing the following photosensitive liquid (1) and a microgel liquid, and stirring the mixture, immediately before coating.

In a case in which no microgel liquid was used, the photosensitive liquid (1) was used as it is as the image recording layer coating liquid.

Photosensitive Liquid (1)

Each compound described in Table 3 to Table 5: each amount described in Table 3 to Table 5
Fluorine-based surfactant (1) [the following structure]: 10 parts
2-Butanone: 5000 parts
1-Methoxy-2-propanol: 4000 parts

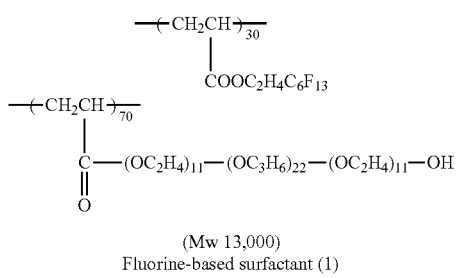

(Mw 13,000)
Fluorine-based surfactant (1)

In Formula above, an additional character (numerical value described with a main chain repeating unit) described with each repeating unit represents the mass percentage of the repeating unit, and an additional character attached to brackets representing an alkylene glycol unit in a side chain represents the number of repeating units with respect to each alkylene glycol unit. The description "Mw" represents the weight average molecular weight value of the entire polymer.

Evaluation of Color Development Property

The lithographic printing plate precursor obtained in each of Examples and Comparative Examples was exposed by Luxel PLATESETTER T-6000111 manufactured by Fujifilm Corporation, on which an infrared light semiconductor laser was mounted, in conditions of a number of rotations of an outer drum of 1,000 rpm, a laser output of 70%, and a resolution of 2,400 dpi (dot per inch, 1 inch=2.54 cm). The exposure image included a solid image and a 50% halftone dot chart of a 20-nm dot FM screen.

The L value of each of the exposed area (solid image) and the unexposed area was measured by an X-Rite (manufactured by X-Rite Inc.), and the difference $\Delta L$ ($\Delta L$=L value of exposed area–L value of unexposed area) was calculated.

It is indicated that the larger the absolute value of $\Delta L$ is, the more excellent the color development property is, and a color development property of 3.0 or more is defined as a favorable value.

Evaluation of Printing Durability

The resulting lithographic printing plate precursor exposed was attached to a plate cylinder of a printer LITHRONE 26 manufactured by Komori Corporation with no development treatment being performed. A water-feed roller was decreased in the speed by 5% with respect to the plate cylinder, thereafter dampening water of Ecolity-2 (manufactured by Fujifilm Corporation)/tap water=2/98 (volume ratio) and a space color fusion G black ink (manufactured by DIC Graphics Corporation) were used, the dampening water and the ink were fed according to a standard automatic printing start method of LITHRONE 26 and subjected to on-press development, and thereafter printing was performed for 30,000 sheets of Tokubishi Art (76.5 kg) paper at a printing rate of 10,000 per hour.

The image recording layer was gradually worn according to an increase in the number of printing sheets, to deteriorate ink reception property, and therefore the ink concentration in the printing sheet was reduced. The printing durability was evaluated under the assumption that the number of print copies, where the value by measurement of the halftone dot area rate of an FM screen 3% halftone dot in a print with an X-Rite (manufactured by X-Rite Inc.) was reduced by 5% as compared with the value measured at the $100^{th}$ sheet in printing, corresponded to the number of printing sheets in completed printing. The printing durability was represented as the relative printing durability as defined below, with the lithographic printing plate precursor in Comparative Example 1 as the standard lithographic printing plate precursor. It is indicated that the larger the relative printing durability is, the higher the printing durability is.

Relative printing durability=(Number of printing sheets (X) in use of objective lithographic printing plate precursor)/(Number of printing sheets (X) in use of standard lithographic printing plate precursor)×100

The evaluation results were described in Table 3 to Table 5.

It is indicated that the larger the numerical value of the relative printing durability is, the more excellent the printing durability is, and a printing durability of 110 or more is favorable.

TABLE 3

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Infrared absorber | IR-1 | 50 | — | — | — | — | — | — | — | — | — |
| | IR-2 | — | 50 | — | — | — | — | — | — | — | — |
| | IR-3 | — | — | 50 | — | — | — | — | — | — | — |
| | IR-4 | — | — | — | 50 | — | — | — | — | — | — |
| | IR-5 | — | — | — | — | 50 | — | — | — | — | — |
| | IR-6 | — | — | — | — | — | 50 | — | — | — | — |
| | IR-7 | — | — | — | — | — | — | 50 | — | — | — |
| | IR-8 | — | — | — | — | — | — | — | 50 | — | — |
| | IR-9 | — | — | — | — | — | — | — | — | 50 | — |
| | IR-10 | — | — | — | — | — | — | — | — | — | 50 |
| | IR-11 | — | — | — | — | — | — | — | — | — | — |
| | IR-12 | — | — | — | — | — | — | — | — | — | — |
| | IR-13 | — | — | — | — | — | — | — | — | — | — |
| | IR-14 | — | — | — | — | — | — | — | — | — | — |
| | Comparative IR-1 | — | — | — | — | — | — | — | — | — | — |
| Polymer particle | PL-1 | — | — | — | — | — | — | — | — | — | — |
| | PL-2 | — | — | — | — | — | — | — | — | — | — |
| | PL-3 | — | — | — | — | — | — | — | — | — | — |
| | PL-4 | — | — | — | — | — | — | — | — | — | — |
| | PL-5 | 200 | 100 | 200 | 200 | 200 | 200 | 200 | 200 | 200 | 200 |
| | PL-6 | — | — | — | — | — | — | — | — | — | — |
| | PL-7 | — | — | — | — | — | — | — | — | — | — |
| | PL-8 | — | — | — | — | — | — | — | — | — | — |
| | PL-9 | — | — | — | — | — | — | — | — | — | — |
| | PL-10 | — | — | — | — | — | — | — | — | — | — |
| | PL-11 | — | — | — | — | — | — | — | — | — | — |
| | PL-12 | — | — | — | — | — | — | — | — | — | — |
| Microgel (1) | | — | — | — | — | — | — | — | — | — | — |
| Leuco compound | R-1 | 50 | 50 | 50 | 50 | 50 | 50 | 50 | 50 | 50 | 50 |
| | R-2 | — | — | — | — | — | — | — | — | — | — |
| | R-3 | — | — | — | — | — | — | — | — | — | — |
| Polymerization initiator | A-1 | — | — | — | — | — | — | — | — | — | — |
| | A-2 | — | — | — | — | — | — | — | — | — | — |
| | A-3 | 100 | 100 | 100 | 100 | 100 | 100 | 100 | 100 | 100 | 100 |
| Polymerizable compound | TMPTA | — | — | — | — | — | — | — | — | — | — |
| | SR454 | — | — | — | — | — | — | — | — | — | — |
| | A-360 | — | — | — | — | — | — | — | — | — | — |
| | SR444 | — | — | — | — | — | — | — | — | — | — |
| | SR295 | — | — | — | — | — | — | — | — | — | — |
| | SR494 | 100 | 100 | 100 | 100 | 100 | 100 | 100 | 100 | 100 | 100 |
| | SR399 | — | — | — | — | — | — | — | — | — | — |
| | A-DPH | — | — | — | — | — | — | — | — | — | — |
| | A9300 | — | — | — | — | — | — | — | — | — | — |
| | UA-510H | 200 | 200 | 200 | 200 | 200 | 200 | 200 | 200 | 200 | 200 |
| | U-15HA | — | — | — | — | — | — | — | — | — | — |
| | U-6LPA | — | — | — | — | — | — | — | — | — | — |
| | UA-1100H | — | — | — | — | — | — | — | — | — | — |
| Binder polymer | HPC | 50 | 50 | 50 | 50 | 50 | 50 | 50 | 50 | 50 | 50 |
| Evaluation results | Color development property | 3.0 | 3.2 | 4.5 | 2.7 | 2.6 | 2.7 | 2.6 | 3.5 | 3.6 | 3.7 |
| | Printing durability | 120 | 130 | 160 | 120 | 120 | 120 | 120 | 140 | 140 | 140 |

| | | Example 11 | Example 12 | Example 13 | Example 14 | Example 15 | Example 16 | Example 17 | Example 18 | Example 19 | Comparative Example 1 |
|---|---|---|---|---|---|---|---|---|---|---|---|
| Infrared absorber | IR-1 | — | — | — | — | — | — | — | — | — | — |
| | IR-2 | — | — | — | — | — | — | — | — | — | — |
| | IR-3 | — | — | — | — | — | 10 | 20 | 100 | 150 | — |
| | IR-4 | — | — | — | — | — | — | — | — | — | — |
| | IR-5 | — | — | — | — | — | — | — | — | — | — |
| | IR-6 | — | — | — | — | — | — | — | — | — | — |
| | IR-7 | — | — | — | — | — | — | — | — | — | — |
| | IR-8 | — | — | — | — | — | — | — | — | — | — |
| | IR-9 | — | — | — | — | — | — | — | — | — | — |
| | IR-10 | — | — | — | — | — | — | — | — | — | — |
| | IR-11 | 50 | — | — | — | — | — | — | — | — | — |
| | IR-12 | — | 50 | — | — | 40 | — | — | — | — | — |

TABLE 3-continued

|  |  |  |  |  |  |  |  |  |  |  |
|---|---|---|---|---|---|---|---|---|---|---|
| Infrared absorber | IR-13 | — | — | 50 | — | — | — | — | — | — | — |
|  | IR-14 | — | — | — | 50 | — | — | — | — | — | — |
|  | Comparative IR-1 | — | — | — | — | 10 | — | — | — | — | 50 |
| Polymer particle | PL-1 | — | — | — | — | — | — | — | — | — | — |
|  | PL-2 | — | — | — | — | — | — | — | — | — | — |
|  | PL-3 | — | — | — | — | — | — | — | — | — | — |
|  | PL-4 | — | — | — | — | — | — | — | — | — | — |
|  | PL-5 | 200 | 200 | 200 | 200 | 200 | 200 | 200 | 200 | 200 | 200 |
|  | PL-6 | — | — | — | — | — | — | — | — | — | — |
|  | PL-7 | — | — | — | — | — | — | — | — | — | — |
|  | PL-8 | — | — | — | — | — | — | — | — | — | — |
|  | PL-9 | — | — | — | — | — | — | — | — | — | — |
|  | PL-10 | — | — | — | — | — | — | — | — | — | — |
|  | PL-11 | — | — | — | — | — | — | — | — | — | — |
|  | PL-12 | — | — | — | — | — | — | — | — | — | — |
| Microgel (1) |  | — | — | — | — | — | — | — | — | — | — |
| Leuco compound | R-1 | 50 | 50 | 50 | 50 | 50 | 50 | 50 | 50 | 50 | 50 |
|  | R-2 | — | — | — | — | — | — | — | — | — | — |
|  | R-3 | — | — | — | — | — | — | — | — | — | — |
| Polymerization initiator | A-1 | — | — | — | — | — | — | — | — | — | — |
|  | A-2 | — | — | — | — | — | — | — | — | — | — |
|  | A-3 | 100 | 100 | 100 | 100 | 100 | 100 | 100 | 100 | 100 | 100 |
| Polymerizable compound | TMPTA | — | — | — | — | — | — | — | — | — | — |
|  | SR454 | — | — | — | — | — | — | — | — | — | — |
|  | A-360 | — | — | — | — | — | — | — | — | — | — |
|  | SR444 | — | — | — | — | — | — | — | — | — | — |
|  | SR295 | — | — | — | — | — | — | — | — | — | — |
|  | SR494 | 100 | 100 | 100 | 100 | 100 | 100 | 100 | 100 | 100 | 100 |
|  | SR399 | — | — | — | — | — | — | — | — | — | — |
|  | A-DPH | — | — | — | — | — | — | — | — | — | — |
|  | A9300 | — | — | — | — | — | — | — | — | — | — |
|  | UA-510H | 200 | 200 | 200 | 200 | 200 | 200 | 200 | 200 | 200 | 200 |
|  | U-15HA | — | — | — | — | — | — | — | — | — | — |
|  | U-6LPA | — | — | — | — | — | — | — | — | — | — |
|  | UA-1100H | — | — | — | — | — | — | — | — | — | — |
| Binder polymer | HPC | 50 | 50 | 50 | 50 | 50 | 50 | 50 | 50 | 50 | 50 |
| Evaluation results | Color development property | 3.8 | 4.7 | 4.6 | 4.6 | 3.8 | 3.2 | 3.6 | 4.5 | 4.5 | 2.6 |
|  | Printing durability | 140 | 150 | 150 | 150 | 120 | 120 | 140 | 160 | 120 | 100 |

TABLE 4

|  |  | Example 3 | Example 20 | Example 21 | Example 22 | Example 23 | Example 24 | Example 25 | Example 26 | Example 27 | Example 28 | Example 29 | Example 30 | Example 31 | Example 32 | Example 33 | Example 34 |
|---|---|---|---|---|---|---|---|---|---|---|---|---|---|---|---|---|---|
| Infrared absorber | IR-1 | — | — | — | — | — | — | — | — | — | — | — | — | — | — | — | — |
|  | IR-2 | — | — | — | — | — | — | — | — | — | — | — | — | — | — | — | — |
|  | IR-3 | 50 | 50 | 50 | 50 | 50 | 50 | 50 | 50 | 50 | 50 | 50 | 50 | 50 | 50 | 50 | 50 |
|  | IR-4 | — | — | — | — | — | — | — | — | — | — | — | — | — | — | — | — |
|  | IR-5 | — | — | — | — | — | — | — | — | — | — | — | — | — | — | — | — |
|  | IR-6 | — | — | — | — | — | — | — | — | — | — | — | — | — | — | — | — |
|  | IR-7 | — | — | — | — | — | — | — | — | — | — | — | — | — | — | — | — |
|  | IR-8 | — | — | — | — | — | — | — | — | — | — | — | — | — | — | — | — |
|  | IR-9 | — | — | — | — | — | — | — | — | — | — | — | — | — | — | — | — |
|  | IR-10 | — | — | — | — | — | — | — | — | — | — | — | — | — | — | — | — |
|  | IR-11 | — | — | — | — | — | — | — | — | — | — | — | — | — | — | — | — |
|  | IR-12 | — | — | — | — | — | — | — | — | — | — | — | — | — | — | — | — |
|  | IR-13 | — | — | — | — | — | — | — | — | — | — | — | — | — | — | — | — |
|  | IR-14 | — | — | — | — | — | — | — | — | — | — | — | — | — | — | — | — |
|  | Comparative IR-1 | — | — | — | — | — | — | — | — | — | — | — | — | — | — | — | — |
| Polymer particle | PL-1 | — | 200 | — | — | — | — | — | — | — | — | — | — | — | — | — | — |
|  | PL-2 | — | — | 200 | — | — | — | — | — | — | — | — | — | — | — | — | — |
|  | PL-3 | — | — | — | 200 | — | — | — | — | — | — | — | — | — | — | — | — |
|  | PL-4 | — | — | — | — | 200 | — | — | — | — | — | — | — | — | — | — | — |
|  | PL-5 | 200 | — | — | — | — | — | — | — | — | — | — | — | 50 | 100 | 300 | 400 |
|  | PL-6 | — | — | — | — | — | 200 | — | — | — | — | — | — | — | — | — | — |
|  | PL-7 | — | — | — | — | — | — | 200 | — | — | — | — | — | — | — | — | — |
|  | PL-8 | — | — | — | — | — | — | — | 200 | — | — | — | — | — | — | — | — |
|  | PL-9 | — | — | — | — | — | — | — | — | 200 | — | — | — | — | — | — | — |
|  | PL-10 | — | — | — | — | — | — | — | — | — | 200 | — | — | — | — | — | — |

TABLE 4-continued

| | | Example 3 | Example 20 | Example 21 | Example 22 | Example 23 | Example 24 | Example 25 | Example 26 | Example 27 | Example 28 | Example 29 | Example 30 | Example 31 | Example 32 | Example 33 | Example 34 |
|---|---|---|---|---|---|---|---|---|---|---|---|---|---|---|---|---|---|
| | PL-11 | — | — | — | — | — | — | — | — | — | — | 200 | — | — | — | — | — |
| | PL-12 | — | — | — | — | — | — | — | — | — | — | — | 200 | — | — | — | — |
| Microgel (1) | | — | — | — | — | — | — | — | — | — | — | — | — | — | — | — | — |
| Leuco compound | R-1 | 50 | 50 | 50 | 50 | 50 | 50 | 50 | 50 | 50 | 50 | 50 | 50 | 50 | 50 | 50 | 50 |
| | R-2 | — | — | — | — | — | — | — | — | — | — | — | — | — | — | — | — |
| | R-3 | — | — | — | — | — | — | — | — | — | — | — | — | — | — | — | — |
| Polymerization initiator | A-1 | — | — | — | — | — | — | — | — | — | — | — | — | — | — | — | — |
| | A-2 | — | — | — | — | — | — | — | — | — | — | — | — | — | — | — | — |
| | A-3 | 100 | 100 | 100 | 100 | 100 | 100 | 100 | 100 | 100 | 100 | 100 | 100 | 100 | 100 | 100 | 100 |
| Polymerizable compound | TMPTA | — | — | — | — | — | — | — | — | — | — | — | — | — | — | — | — |
| | SR454 | — | — | — | — | — | — | — | — | — | — | — | — | — | — | — | — |
| | A-360 | — | — | — | — | — | — | — | — | — | — | — | — | — | — | — | — |
| | SR444 | — | — | — | — | — | — | — | — | — | — | — | — | — | — | — | — |
| | SR295 | — | — | — | — | — | — | — | — | — | — | — | — | — | — | — | — |
| | SR494 | 100 | 100 | 100 | 100 | 100 | 100 | 100 | 100 | 100 | 100 | 100 | 100 | 100 | 100 | 100 | 100 |
| | SR399 | — | — | — | — | — | — | — | — | — | — | — | — | — | — | — | — |
| | A-DPH | — | — | — | — | — | — | — | — | — | — | — | — | — | — | — | — |
| | A9300 | — | — | — | — | — | — | — | — | — | — | — | — | — | — | — | — |
| | UA-510H | 200 | 200 | 200 | 200 | 200 | 200 | 200 | 200 | 200 | 200 | 200 | 200 | 200 | 200 | 200 | 200 |
| | U-15HA | — | — | — | — | — | — | — | — | — | — | — | — | — | — | — | — |
| | U-6LPA | — | — | — | — | — | — | — | — | — | — | — | — | — | — | — | — |
| | UA-1100H | — | — | — | — | — | — | — | — | — | — | — | — | — | — | — | — |
| Binder polymer | HPC | 50 | 50 | 50 | 50 | 50 | 50 | 50 | 50 | 50 | 50 | 50 | 50 | 50 | 50 | 50 | 50 |
| Evaluation results | Color development property | 4.5 | 4.5 | 4.5 | 4.5 | 4.5 | 4.5 | 4.5 | 4.5 | 4.5 | 4.5 | 4.5 | 4.5 | 4.5 | 4.5 | 4.5 | 4.5 |
| | Printing durability | 160 | 110 | 150 | 160 | 150 | 160 | 160 | 150 | 140 | 130 | 140 | 130 | 120 | 140 | 160 | 160 |

TABLE 5

| | | Example 3 | Example 35 | Example 36 | Example 37 | Example 38 | Example 39 | Example 40 | Example 41 | Example 42 | Example 43 | Example 44 |
|---|---|---|---|---|---|---|---|---|---|---|---|---|
| Infrared absorber | IR-1 | — | — | — | — | — | — | — | — | — | — | — |
| | IR-2 | — | — | — | — | — | — | — | — | — | — | — |
| | IR-3 | 50 | 50 | 50 | 50 | 50 | 50 | 50 | 50 | 50 | 50 | 50 |
| | IR-4 | — | — | — | — | — | — | — | — | — | — | — |
| | IR-5 | — | — | — | — | — | — | — | — | — | — | — |
| | IR-6 | — | — | — | — | — | — | — | — | — | — | — |
| | IR-7 | — | — | — | — | — | — | — | — | — | — | — |
| | IR-8 | — | — | — | — | — | — | — | — | — | — | — |
| | IR-9 | — | — | — | — | — | — | — | — | — | — | — |
| | IR-10 | — | — | — | — | — | — | — | — | — | — | — |
| | IR-11 | — | — | — | — | — | — | — | — | — | — | — |
| | IR-12 | — | — | — | — | — | — | — | — | — | — | — |
| | IR-13 | — | — | — | — | — | — | — | — | — | — | — |
| | IR-14 | — | — | — | — | — | — | — | — | — | — | — |
| | Comparative IR-1 | — | — | — | — | — | — | — | — | — | — | — |
| Polymer particle | PL-1 | — | — | — | — | — | — | — | — | — | — | — |
| | PL-2 | — | — | — | — | — | — | — | — | — | — | — |
| | PL-3 | — | — | — | — | — | — | — | — | — | — | — |
| | PL-4 | — | — | — | — | — | — | — | — | — | — | — |
| | PL-5 | 200 | 200 | 200 | 200 | 200 | 200 | 200 | 200 | 200 | 200 | 200 |
| | PL-6 | — | — | — | — | — | — | — | — | — | — | — |
| | PL-7 | — | — | — | — | — | — | — | — | — | — | — |
| | PL-8 | — | — | — | — | — | — | — | — | — | — | — |
| | PL-9 | — | — | — | — | — | — | — | — | — | — | — |
| | PL-10 | — | — | — | — | — | — | — | — | — | — | — |
| | PL-11 | — | — | — | — | — | — | — | — | — | — | — |
| | PL-12 | — | — | — | — | — | — | — | — | — | — | — |
| Microgel (1) | | — | — | — | — | — | — | — | — | — | — | — |
| Leuco compound | R-1 | 50 | — | — | — | — | — | — | — | — | — | — |
| | R-2 | — | 50 | — | — | — | — | — | — | — | — | — |
| | R-3 | — | — | 50 | — | — | — | — | — | — | — | — |
| Polymerization initiator | A-1 | — | — | — | 100 | — | — | — | — | — | — | — |
| | A-2 | — | — | — | — | 100 | — | — | — | — | — | — |
| | A-3 | 100 | 100 | 100 | | | 100 | 100 | 100 | 100 | 100 | 100 |

TABLE 5-continued

| | | | | | | | | | | | | |
|---|---|---|---|---|---|---|---|---|---|---|---|---|
| Polymerizable compound | TMPTA | — | — | — | — | — | 100 | — | — | — | — | — |
| | SR454 | — | — | — | — | — | — | 100 | — | — | — | — |
| | A-360 | — | — | — | — | — | — | — | 100 | — | — | — |
| | SR444 | — | — | — | — | — | — | — | — | 100 | — | — |
| | SR295 | — | — | — | — | — | — | — | — | — | 100 | — |
| | SR494 | 100 | 100 | 100 | 100 | 100 | — | — | — | — | — | — |
| | SR399 | — | — | — | — | — | — | — | — | — | — | 100 |
| | A-DPH | — | — | — | — | — | — | — | — | — | — | — |
| | A9300 | — | — | — | — | — | — | — | — | — | — | — |
| | UA-510H | 200 | 200 | 200 | 200 | 200 | 200 | 200 | 200 | 200 | 200 | 200 |
| | U-15HA | — | — | — | — | — | — | — | — | — | — | — |
| | U-6LPA | — | — | — | — | — | — | — | — | — | — | — |
| | UA-1100H | — | — | — | — | — | — | — | — | — | — | — |
| Binder polymer | HPC | 50 | 50 | 50 | 50 | 50 | 50 | 50 | 50 | 50 | 50 | 50 |
| Evaluation results | Color development property | 4.5 | 4.5 | 4.5 | 3.5 | 3.6 | 3.6 | 3.6 | 3.6 | 3.6 | 3.6 | 3.6 |
| | Printing durability | 160 | 160 | 160 | 130 | 160 | 120 | 120 | 120 | 120 | 120 | 160 |

| | | Example 45 | Example 46 | Example 47 | Example 48 | Example 49 | Example 50 | Example 51 | Example 52 | Example 53 | Example 54 |
|---|---|---|---|---|---|---|---|---|---|---|---|
| Infrared absorber | IR-1 | — | — | — | — | — | — | — | — | — | — |
| | IR-2 | — | — | — | — | — | — | — | — | — | — |
| | IR-3 | 50 | 50 | 50 | 50 | 50 | 50 | 50 | 50 | 50 | 50 |
| | IR-4 | — | — | — | — | — | — | — | — | — | — |
| | IR-5 | — | — | — | — | — | — | — | — | — | — |
| | IR-6 | — | — | — | — | — | — | — | — | — | — |
| | IR-7 | — | — | — | — | — | — | — | — | — | — |
| | IR-8 | — | — | — | — | — | — | — | — | — | — |
| | IR-9 | — | — | — | — | — | — | — | — | — | — |
| | IR-10 | — | — | — | — | — | — | — | — | — | — |
| | IR-11 | — | — | — | — | — | — | — | — | — | — |
| | IR-12 | — | — | — | — | — | — | — | — | — | — |
| | IR-13 | — | — | — | — | — | — | — | — | — | — |
| | IR-14 | — | — | — | — | — | — | — | — | — | — |
| | Comparative IR-1 | — | — | — | — | — | — | — | — | — | — |
| Polymer particle | PL-1 | — | — | — | — | — | — | — | — | — | — |
| | PL-2 | — | — | — | — | — | — | — | — | — | — |
| | PL-3 | — | — | — | — | — | — | — | — | — | — |
| | PL-4 | — | — | — | — | — | — | — | — | — | — |
| | PL-5 | 200 | 200 | 200 | 200 | 200 | 200 | 200 | 200 | 200 | — |
| | PL-6 | — | — | — | — | — | — | — | — | — | — |
| | PL-7 | — | — | — | — | — | — | — | — | — | — |
| | PL-8 | — | — | — | — | — | — | — | — | — | — |
| | PL-9 | — | — | — | — | — | — | — | — | — | — |
| | PL-10 | — | — | — | — | — | — | — | — | — | — |
| | PL-11 | — | — | — | — | — | — | — | — | — | — |
| | PL-12 | — | — | — | — | — | — | — | — | — | — |
| Microgel (1) | | — | — | — | — | — | — | — | 100 | — | — |
| Leuco compound | R-1 | — | — | — | — | — | — | — | — | — | — |
| | R-2 | — | — | — | — | — | — | — | — | — | — |
| | R-3 | — | — | — | — | — | — | — | — | — | — |
| Polymerization initiator | A-1 | — | — | — | — | — | — | — | — | — | — |
| | A-2 | — | — | — | — | — | — | — | — | — | — |
| | A-3 | 100 | 100 | 100 | 100 | 100 | 100 | 100 | 100 | 100 | 100 |
| Polymerizable compound | TMPTA | — | — | — | — | — | — | — | — | — | — |
| | SR454 | — | — | — | — | — | — | — | — | — | — |
| | A-360 | — | — | — | — | — | — | — | — | — | — |
| | SR444 | — | — | — | — | — | — | — | — | — | — |
| | SR295 | — | — | — | — | — | — | — | — | — | — |
| | SR494 | — | — | — | — | — | — | — | — | 100 | 100 |
| | SR399 | — | — | — | — | — | — | — | — | — | — |
| | A-DPH | 100 | — | — | — | — | — | — | — | — | — |
| | A9300 | — | 100 | — | — | — | — | — | — | — | — |
| | UA-510H | 200 | 200 | 200 | 200 | 200 | — | — | — | 200 | 200 |
| | U-15HA | — | — | 100 | — | — | 300 | 300 | 300 | — | — |
| | U-6LPA | — | — | — | 100 | — | — | — | — | — | — |
| | UA-1100H | — | — | — | — | 100 | — | — | — | — | — |

TABLE 5-continued

| Binder polymer | HPC | 50 | 50 | 50 | 50 | 50 | 50 | — | — | — | — |
|---|---|---|---|---|---|---|---|---|---|---|---|
| Evaluation results | Color development property | 3.6 | 3.6 | 3.6 | 3.6 | 3.6 | 3.6 | 3.6 | 3.6 | 3.6 | 3.6 |
| | Printing durability | 160 | 140 | 180 | 160 | 160 | 170 | 160 | 180 | 140 | 110 |

In Table 3 to Table 5, each numerical value represents the content (part(s) by mass) of each corresponding component. The detail of abbreviations is as described below.

- IR-1 to IR-14: specified infrared absorbers shown as specific examples described above
- Comparative IR-1: infrared absorber having the following structure
- PL-1 to PL-12: synthesized articles described above
- R-1: Black 15, manufactured by YAMADA CHEMICAL CO., LTD.
- R-2: Red 500, manufactured by YAMADA CHEMICAL CO., LTD.
- R-3: S205, manufactured by YAMADA CHEMICAL CO., LTD.
- A-1 to A-3: polymerization initiators shown as specific examples described above
- Polymerizable compound: polymerizable compound described in Table 6 below
- HPC: hydroxypropylcellulose

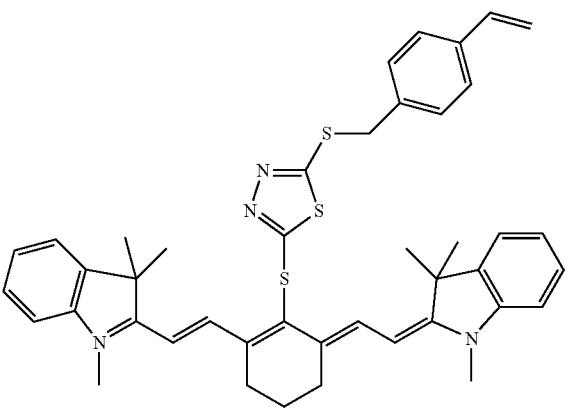

Comparative IR-1

TABLE 6

| Name | Structure | Manufacturer |
|---|---|---|
| TMPA | | Sartomer |
| SR454 | | Sartomer |
| A-360 | | TOAGOSEI CO., LTD. |

TABLE 6-continued
| Name | Structure | Manufacturer |
| --- | --- | --- |
| SR444 | 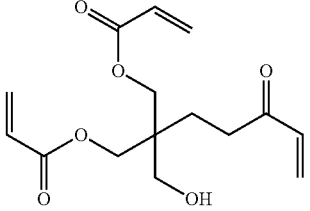 [SMILES: C=CC(=O)CCC(CO)(COC(=O)C=C)COC(=O)C=C] | Sartomer |
| SR295 | 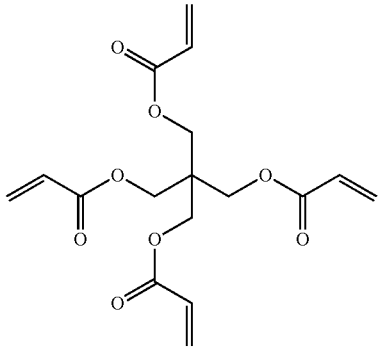 [SMILES: C=CC(=O)OCC(COC(=O)C=C)(COC(=O)C=C)COC(=O)C=C] | Sartomer |
| SR494 | 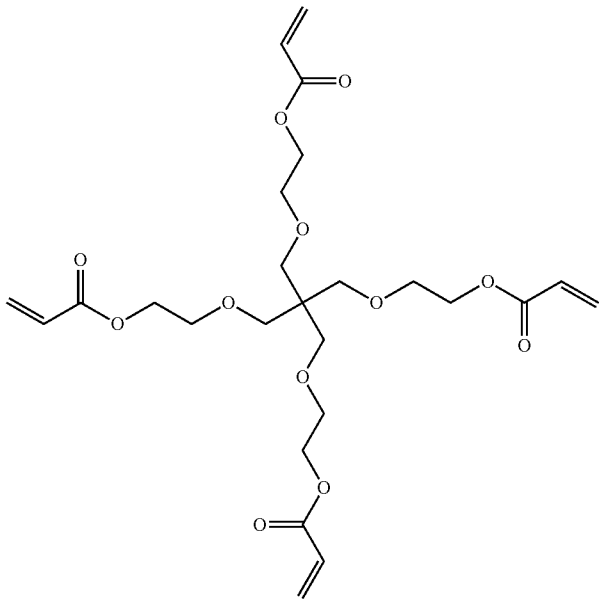 [SMILES: C=CC(=O)OCCOCC(COCCOC(=O)C=C)(COCCOC(=O)C=C)COCCOC(=O)C=C] | Sartomer |

TABLE 7

| Name | Structure | Manufacturer |
| --- | --- | --- |
| SR399 | (pentaerythritol-based pentaacrylate with hydroxyl group) | Sartomer |
| A-DPH | (dipentaerythritol hexaacrylate) | SHIN NAKAMURA CHEMICAL CO., LTD. |
| A9300 | (tris(2-acryloyloxyethyl) isocyanurate) | SHIN NAKAMURA CHEMICAL CO., LTD. |
| UA-510H | Urethane oligomer: decafunctional | KYOEISHA CHEMICAL Co., LTD. |
| U-15HA | Urethane oligomer: pentadecafunctional | SHIN NAKAMURA CHEMICAL CO., LTD. |
| U-6LPA | Urethane oligomer: hexafunctional | SHIN NAKAMURA CHEMICAL CO., LTD. |
| UA-1100H | Urethane oligomer: hexafunctional | SHIN NAKAMURA CHEMICAL CO., LTD. |

Examples 55 and 56

The lithographic printing plate precursor used in Example 1 or Example 3 was subjected to the same exposure as the exposure in evaluation of the color development property, and thereafter the printing durability was evaluated according to the following method.

Development Treatment

The lithographic printing plate precursor was subjected to a development treatment using a development treatment apparatus A exemplified in FIG. 1.

The "development treatment" here means not only development of the image formation layer, but also a composite treatment including one or more selected from the group consisting of removal of the protective layer, gumming and drying, if necessary.

The treatment liquid used in the development treatment was a treatment liquid having the following composition.

Treatment Liquid

Anionic surfactant (PELEX NBL): 2% by mass
Nonionic surfactant (Newcol B13): 5% by mass
2-Phosphonobutane-1,2,4-tricarboxylic acid (BAYHIBIT AM (trademark)): 2% by mass
Benzyl alcohol: 0.8% by mass
Defoamer (polydimethylsiloxane, manufactured by Bluestar Silicones, ILCOLAPSE 432): 0.02% by mass
Water: 92.18% by mass The development treatment apparatus A is an automatic treatment machine having two rolling brush rolls 11. A first rolling brush roll 11 of the rolling brush rolls 11, here used, was a brush roll having an outer diameter of 90 mm, to which a polybutylene terephthalate fiber (bristle diameter: 200 μm, bristle length: 17 mm) was implanted, and the first rolling brush roll 11 was rotated at 200 rpm (circumferential velocity of brush tip: 0.94 m/sec) in the same direction as the conveyance direction. A second rolling brush roll 11 here used was a brush roll having an outer diameter of 60 mm, to which a polybutylene terephthalate fiber (bristle diameter: 200 μm, bristle length: 17 mm) was implanted, and the second rolling brush roll 11 was rotated at 200 rpm (circumferential velocity of brush tip: 0.63 m/sec) in an opposite direction to the conveyance direction. A lithographic printing plate precursor 30 exposed was conveyed among three pairs of conveyance rolls 13 from a plate charge stand 18 to a plate discharge stand 19 on a conveyance guide plate 14 provided midway at a conveyance rate of 100 cm/min in a conveyance direction illustrated, so that the lithographic printing plate precursor 30 passed between the rolling brush rolls 11 and a backing roll 12 located opposite thereto.

The treatment liquid stored in a treatment liquid tank 20 was fed by a circulation pump 21 from a pipe line 16 through a filter 17 to a spray pipe 15 located at each of four positions, and showered from each spray pipe 15 to the plate surface. The volume of the treatment liquid tank 20 was 10 L, and the treatment liquid was used with circulation. The lithographic printing plate discharged from a development treatment machine was dried by a drier 22 without being washed with water.

Evaluation of Printing Durability

The resulting lithographic printing plate after the development treatment was used to evaluate the printing durability according to the same manner as in the evaluation of the printing durability except that no on-press development was performed.

The evaluation results in use of the lithographic printing plate precursor used in Example 1 were the same as the evaluation results of Example 1 described in Table 3, and the evaluation results in use of the lithographic printing plate precursor used in Example 3 were the same as the evaluation results of Example 3, respectively.

It can be seen from the results of Examples and Comparative Examples that the lithographic printing plate precursor according to the disclosure is excellent in printing durability of the resulting lithographic printing plate.

It can be seen from the results of Examples and Comparative Examples that the method of producing a lithographic printing plate and the lithographic printing method according to the disclosure provide a lithographic printing plate excellent in printing durability.

The disclosure of Japanese Patent Application No. 2017-037664 filed on Feb. 28, 2017 is herein incorporated by reference in its entirety.

BRIEF DESCRIPTION OF DRAWING

FIG. 1 is a schematic view illustrating one structure example of a development treatment apparatus used in the invention.

REFERENCE SINGS LIST

11: rolling brush roll
12: backing roll
13: conveyance roll
14: conveyance guide plate
15: spray pipe
16: pipe line
17: filter
18: plate charge stand
19: plate discharge stand
20: treatment liquid tank
21: circulation pump
22: drier
30: lithographic printing plate precursor

What is claimed is:

1. A lithographic printing plate precursor comprising an image recording layer containing an infrared absorber represented by Formula II, a polymerizable compound, and a polymerization initiator on a support, wherein the polymerizable compound contains a deca- or higher polyfunctional ethylenically unsaturated compound and further contains an unsaturated ester of alcohol, wherein the unsaturated ester of alcohol is a tri- or higher polyfunctional ethylenically unsaturated compound:

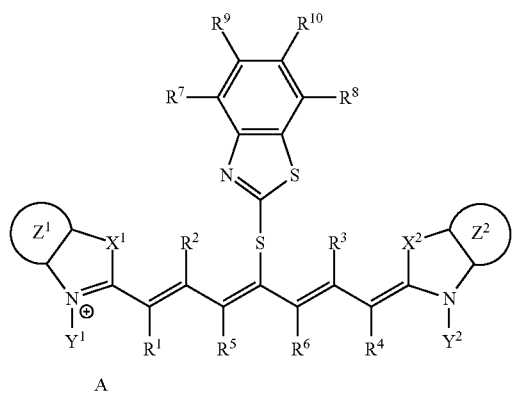

Formula II in Formula II, each of $X^1$ and $X^2$ independently represents a sulfur atom, an oxygen atom, or a dialkylmethylene group having 12 or less carbon atoms, each of $Y^1$ and $Y^2$ independently represents a monovalent organic group or a hydrogen atom, each of $Z^1$ and $Z^2$ independently represents a benzene ring unsubstituted or substituted with an electron-donating group or an aryl group having from 6 to 20 carbon atoms, a naphthalene ring unsubstituted or substituted with an electron-donating group or an aryl group having from 6 to 20 carbon atoms, or a 6- to 20-membered heteroaromatic ring unsubstituted or substituted with an electron-donating group or an aryl group having from 6 to 20 carbon atoms, each of $R^1$, $R^2$, $R^3$, and $R^4$ independently represents a hydrogen atom or a hydrocarbon group having 12 or less carbon atoms, each of $R^7$, $R^8$, $R^9$, and $R^{10}$ independently represents a hydrogen atom or a monovalent organic group, and A represents a counter ion present in a case in which charge neutralization is needed.

2. The lithographic printing plate precursor according to claim 1,
wherein in Formula II, each of $X^1$ and $X^2$ independently represents a dialkylmethylene group having 12 or less carbon atoms, each of $Y^1$ and $Y^2$ independently represents an alkyl group having from 1 to 10 carbon atoms, each of $Z^1$ and $Z^2$ independently represents an unsubstituted benzene ring, each of $R^1$, $R^2$, $R^3$, and $R^4$ independently represents a hydrogen atom, and each of $R^7$, $R^8$, $R^9$, and $R^{10}$ independently represents a hydrogen atom.

3. The lithographic printing plate precursor according to claim 1,
wherein the polymerization initiator is a diphenyliodonium salt substituted with an alkyl group.

4. The lithographic printing plate precursor according to claim 1, wherein the image recording layer further contains a leuco compound.

5. The lithographic printing plate precursor according to claim 1, wherein the image recording layer is removable by one or both of dampening water and a printing ink.

6. A method of producing a lithographic printing plate, comprising:
an exposure step of image-wise exposing the lithographic printing plate precursor according to claim 1, to form an exposed area and an unexposed area; and
an on-press development step of feeding at least one of a printing ink or dampening water to remove the unexposed area.

7. The lithographic printing plate precursor according to claim 1, wherein the image recording layer further contains a thermoplastic polymer particle, and a polymer contained in the thermoplastic polymer particle contains a monomer unit derived from styrene and a monomer unit derived from an acrylic compound.

8. The lithographic printing plate precursor according to claim 7,
wherein in Formula II, each of $X^1$ and $X^2$ independently represents a dialkylmethylene group having 12 or less carbon atoms, each of $Y^1$ and $Y^2$ independently represents an alkyl group having from 1 to 10 carbon atoms, each of $Z^1$ and $Z^2$ independently represents an unsubstituted benzene ring, each of $R^1$, $R^2$, $R^3$, and $R^4$ independently represents a hydrogen atom, and each of $R^7$, $R^8$, $R^9$, and $R^{10}$ independently represents a hydrogen atom.

* * * * *